(12) United States Patent
Yoshida et al.

(10) Patent No.: US 12,148,468 B2
(45) Date of Patent: Nov. 19, 2024

(54) SEMICONDUCTOR MEMORY DEVICE AND CONTROL DEVICE FOR SEMICONDUCTOR MEMORY DEVICE

(71) Applicant: POWER SPIN INC., Miyagi (JP)

(72) Inventors: Hiroshi Yoshida, Miyagi (JP);
Toshimasa Namekawa, Miyagi (JP);
Satoru Araki, Miyagi (JP); Etsuo Fukuda, Miyagi (JP); Tetsuo Endoh, Miyagi (JP)

(73) Assignee: POWER SPIN INC., Sendai (JP)

( * ) Notice: Subject to any disclaimer, the term of this patent is extended or adjusted under 35 U.S.C. 154(b) by 189 days.

(21) Appl. No.: 18/056,341

(22) Filed: Nov. 17, 2022

(65) Prior Publication Data

US 2023/0154532 A1    May 18, 2023

(30) Foreign Application Priority Data

Nov. 18, 2021  (JP) ................ 2021-188194

(51) Int. Cl.
*G11C 13/00* (2006.01)

(52) U.S. Cl.
CPC ........ *G11C 13/004* (2013.01); *G11C 13/0033* (2013.01); *G11C 2013/0054* (2013.01)

(58) Field of Classification Search
CPC .............. G11C 13/004; G11C 13/0033; G11C 13/0023; G11C 13/0026; G11C 13/0028; G11C 2013/0054; G11C 2213/79; G11C 11/1653; G11C 11/1655; G11C 11/1657; G11C 11/1659; G11C 11/1673
See application file for complete search history.

(56) References Cited

U.S. PATENT DOCUMENTS

2018/0350419 A1* 12/2018 Koike ................ G11C 11/161

FOREIGN PATENT DOCUMENTS

| JP | 2856848 B2 | 2/1999 |
| JP | 3873055 B2 | 1/2007 |
| JP | 6749021 B2 | 9/2020 |

* cited by examiner

*Primary Examiner* — Tan T. Nguyen
(74) *Attorney, Agent, or Firm* — Pearne & Gordon LLP

(57) ABSTRACT

A semiconductor memory device includes a memory cell array including a plurality of memory cells each including a resistance change type memory element configured to store a resistance state and a switch, a read determination circuit that compares a measurement signal from the memory cell selected in the memory cell array with a reference signal to determine a resistance state so as to read information from the resistance change type memory element, and a reference signal correction unit that corrects a level of the reference signal based on a selected position of the memory cell in the memory cell array.

15 Claims, 16 Drawing Sheets

| a10 | H | H | L | L |
|---|---|---|---|---|
| a9 | H | L | H | L |
| a8-a0 | * | * | * | * |
| a109[3] | H | L | L | L |
| a109[2] | L | H | L | L |
| a109[1] | L | L | H | L |
| a109[0] | L | L | L | H |
| WL (PHYSICAL ADDRESS) /REGION | 2047-1536 /104 | 1535-1024 /103 | 1023-512 /102 | 511-0 /101 |

SEMICONDUCTOR MEMORY DEVICE AND CONTROL DEVICE FOR SEMICONDUCTOR MEMORY DEVICE

CROSS REFERENCE TO RELATED APPLICATIONS

This application claims the benefit of foreign priority to Japanese Patent Application No. 2021-188194, filed on Nov. 18, 2021, which is incorporated by reference in its entirety.

BACKGROUND OF THE INVENTION

Technical Field

The present invention relates to a semiconductor memory device using a resistance change type memory element, and a control device for a semiconductor memory device.

Description of the Related Art

In recent years, in a semiconductor memory device, instead of a volatile memory (for example, a dynamic random access memory (DRAM) or a static random access memory (SRAM)) that requires a power source for holding recorded information, use of a nonvolatile memory (for example, a magneto-resistive random access memory (MRAM)) that does not require a power source for holding recorded information has been studied.

The MRAM includes a ferromagnetic element as a resistance change type memory element, and stores information using a difference in a resistance state of the ferromagnetic element. In the case of reading information from such a resistance change type memory element, a predetermined ferromagnetic element is selected, and a resistance value of the selected ferromagnetic element is measured. Then, by determining whether the ferromagnetic element is in a high resistance state or a low resistance state, the stored information can be read.

Japanese Patent No. 3873055 discloses a technique related to a semiconductor memory element using a ferromagnetic element as a memory element.

According to this technology, in a memory cell array configured by two-dimensionally arranged memory cells, a resistance state of a predetermined memory cell is determined to read stored information. A resistance state is determined by a read determination circuit (for example, a sense amplifier) that is provided at an end portion in the column direction of the array of memory cells, receives two inputs of a measurement signal and a reference signal, compares the two inputs, and determines a read value.

Specifically, memory cells set to a reference level are arranged in the same row of the memory array, and the read determination circuit receives a measurement signal from a memory cell from which information is to be read from one terminal. At the same time, when the reference signal from the memory cell set to the reference level in the same row of the memory array is received at the other terminal, the magnitudes of the measurement signal and the reference signal are compared. As a result, the resistance state of the memory cell is determined, and the stored information can be read.

Similarly, technologies related to a semiconductor memory element using a ferromagnetic element are disclosed in Japanese Patent No. 6749021 and Japanese Patent No. 2856848.

SUMMARY OF THE INVENTION

Here, in the resistance change type memory element, a wiring parasitic resistance of a current path at the time of measuring the resistance value is relatively large (for example, several kΩ), which may affect the determination of the resistance state. In addition, with miniaturization of a semiconductor manufacturing process, the smaller the memory element, the greater the influence of the wiring parasitic resistance. Therefore, when an attempt is made to suppress the influence of the wiring parasitic resistance in order to measure the resistance value, downsizing of the entire configuration and size of the semiconductor memory device is limited.

For example, in a case where the technology disclosed in Japanese Patent No. 3873055 is applied to a one-cell method, that is, a configuration in which a memory cell operates alone, both the measurement signal and the reference signal are affected by the wiring parasitic resistance of a data line DL and a source line SL.

In the ferromagnetic element, a difference in measured current between the high resistance state and the low resistance state is extremely small. Therefore, even when the resistance value of the reference memory cell is set to a level that can be compared by the read determination circuit, it is difficult to appropriately determine the resistance state of the memory cell due to the influence of the wiring parasitic resistance.

In addition, in a case where the technology disclosed in Japanese Patent No. 3873055 is applied to a two-cell configuration in which memory cells operate in pairs, reference memories are also set in pairs. Specifically, the resistance values of the paired reference memory cells are set to the high resistance state and the low resistance state, and an intermediate value of outputs from these reference memory cells is used as a reference signal.

However, in order to set the reference memory cell to two resistance states of the high resistance state and the low resistance state, it is necessary to provide a data line and a source line in each of the paired reference memory cells. Furthermore, since the data line and the source line are connected in parallel in order to obtain the intermediate value between the high resistance state and the low resistance state, the wiring parasitic resistance is reduced as a whole. Therefore, since the influence of the wiring parasitic resistance in the measurement signal input to the read determination circuit and the reference signal is not equivalent, there is a possibility that the measurement signal needs to be corrected.

As described above, in the semiconductor memory device using the ferromagnetic element as the memory element, since the difference in the measured current between the high resistance state and the low resistance state is extremely small, the semiconductor memory device is more susceptible to the influence of the wiring parasitic resistance, so that the level range of the reference signal used for determining the resistance state is limited. Therefore, there is a problem that when reading of the memory cell is performed without being affected by the wiring parasitic resistance, a region where the memory cell can be arranged is limited.

The present invention has been made to solve such a problem, and an object of the present invention is to provide a semiconductor memory device that reduces the influence of wiring parasitic resistance at the time of reading information and expands a region where memory cells can be arranged, and a control device for the semiconductor memory device.

According to an aspect of the present invention, there is provided a semiconductor memory device including: a memory cell array including a plurality of memory cells each including a resistance change type memory element configured to store a resistance state and a switch; a read determination circuit that compares a measurement signal from the memory cell selected in the memory cell array with a reference signal to determine a resistance state so as to read information from the resistance change type memory element; and a reference signal correction unit that corrects a level of the reference signal based on a selected position of the memory cell in the memory cell array.

According to another aspect of the present invention, a control device for a semiconductor memory device reads a storage content of a memory cell from the semiconductor memory device including a memory cell array including a plurality of memory cells each including a resistance change type memory element configured to store a resistance state and a switch, and a read determination circuit that compares a measurement signal from the memory cell selected in the memory cell array with a reference signal. The control device corrects a level of the reference signal output from a reference signal generation unit based on a selected position of the memory cell in the memory cell array, causes the read determination circuit to compare the measurement signal from the memory cell selected in the memory cell array with the reference signal, and determines a resistance state of the resistance change type memory element based on a comparison result by the read determination circuit.

According to the semiconductor memory device of one aspect of the present invention, the reference signal correction unit corrects the level of the reference signal according to the selected position of the memory cell. Here, the measurement signal, which is one input of the read determination circuit, is affected by a wiring parasitic resistance corresponding to the selected position of the memory cell. Meanwhile, the reference signal which is the other input of the read determination circuit is corrected according to the selected position of the memory cell by the reference signal correction unit, and thus, is affected by the wiring parasitic resistance according to the selected position.

As described above, in both the measurement signal and the reference signal input to the read determination circuit, it becomes that the influence of the equivalent wiring parasitic resistance according to the selected position of the memory cell is included. As a result, since it is possible to reduce the influence of the wiring parasitic resistance at the time of comparison between the measurement signal and the reference signal, it is possible to expand a region where the memory cells can be arranged.

DETAILED DESCRIPTION

Figure 1:
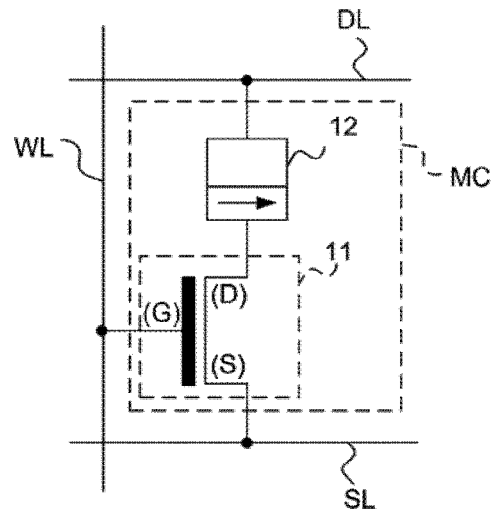
FIG. 1 is a schematic configuration diagram of a memory cell constituting a semiconductor memory device of a comparative example.

Hereinafter, embodiments of the present invention will be described with reference to the drawings. In the description of the embodiments, the scope of the present invention is not necessarily limited to the number, the amount, and the like, unless the number, the amount, and the like are mentioned or particularly described. In the drawings illustrating the embodiments, the same names indicate the same or corresponding parts. In addition, in the description of the embodiment, redundant description will not be repeated for portions and the like denoted with the same names.

First, before describing an embodiment according to the invention of the present application, a configuration and operation of a semiconductor memory device of a comparative example not including a reference signal correction unit according to the invention of the present application will be described.

COMPARATIVE EXAMPLE

FIG. 1 is a schematic configuration diagram of a memory cell constituting a semiconductor memory device of a comparative example. FIG. 1 illustrates a resistance change type memory cell MC (Memory Cell) including a MOS type transistor 11 (Metal-oxide-semiconductor Transistor) and a ferromagnetic element 12 (Magnetic Tunneling Junction (MTJ) element).

The transistor 11 is a semiconductor switch including a gate (G), a source (S), and a drain (D). Conduction between the source (S) and the drain (D) is controlled by applying a voltage to the gate (G). In the transistor 11, the gate (G) is connected to a word line WL, the source (S) is connected to a source line SL, and the drain (D) is connected to one end of the ferromagnetic element 12. The other end of the ferromagnetic element 12 is connected to a data line DL. The MOS transistor 11 is an example of a switch included in the memory cell MC, but is not limited thereto, and may be various switches used for a semiconductor memory device.

The ferromagnetic element 12 corresponds to a magnetoresistive random access memory (MRAM) type memory element, and is configured to be able to variably store a magnetization direction. A resistance state of the ferromagnetic element 12 changes to a low resistance state (parallel state) or a high resistance state (antiparallel state) according to the magnetization direction. By measuring a resistance value of the ferromagnetic element 12 and determining the resistance state, a storage content of the memory cell MC can be read.

Figure 2A:
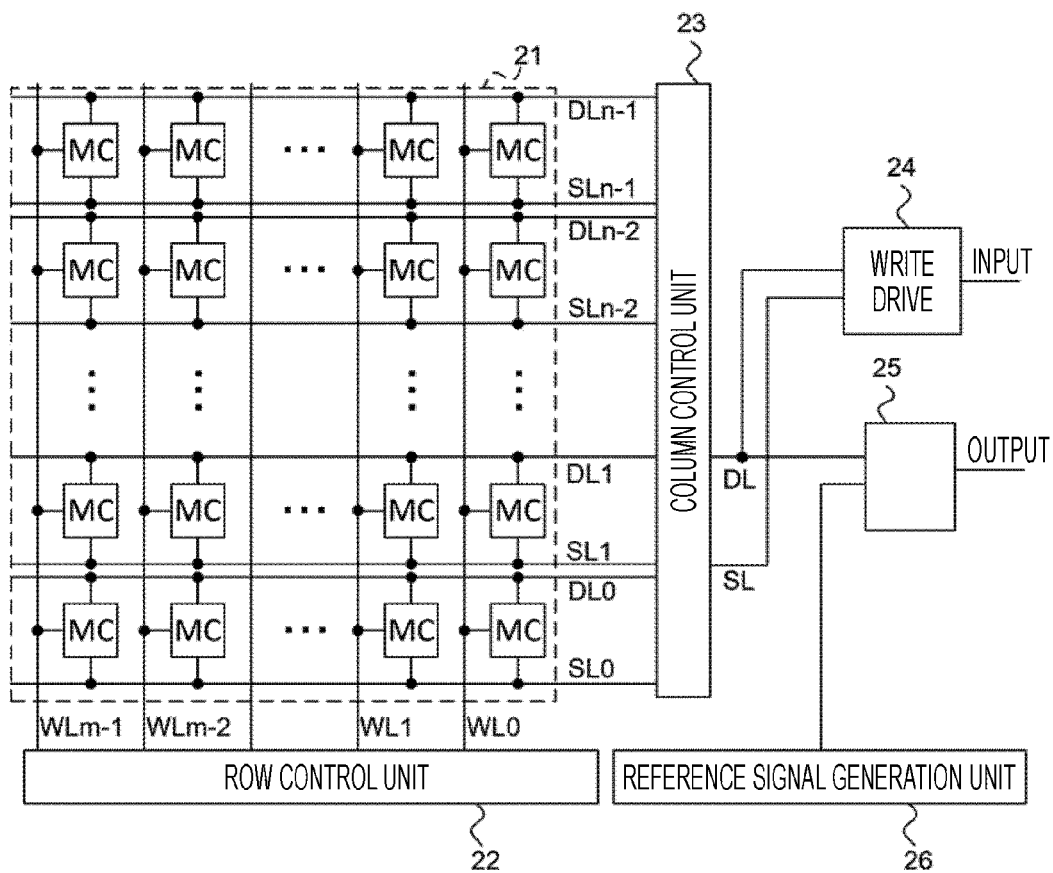
FIG. 2A is a schematic circuit configuration diagram of a memory cell array including a plurality of memory cells and a periphery thereof.

FIG. 2A is a schematic circuit configuration diagram of a memory cell array including a plurality of memory cells MC and a periphery thereof. In FIG. 2A, a memory cell array 21 including a plurality of memory cells MC arranged two-dimensionally and a peripheral circuit configuration thereof are illustrated. In the two-dimensionally arranged memory cells MC, the memory cells MC of the same row are connected to the same word line WL, and the memory cells MC of the same column are connected to the same data line DL and source line SL. Word lines WL0 to WLm−1 are provided from a right side to a left side in FIG. 2A, and data lines DL0 to DLn−1 and the source lines SL0 to SLn−1 are provided from a lower side to an upper side in FIG. 2A.

The word lines WL0 to WLm−1 are connected to a row control unit 22, and the data lines DL0 to DLn−1 and the source lines SL0 to SLn−1 are connected to a column control unit 23. The row control unit 22 and the column control unit 23 control one of the word lines WL, one of the data lines DL, and one of the source lines SL to select a memory cell MC to be read and written.

The row control unit 22 includes a row decoder and a word drive. When receiving a signal specifying a read/write target memory cell MC, the row decoder selects a word line WL of the read/write target memory cell MC. Here, the word drive includes an address bus connected to the word lines WL to WLm−1, and receives an input of an address signal corresponding to the address bus. Therefore, when the row decoder outputs an address signal corresponding to the selected word line WL to the word drive, a voltage is applied to a predetermined address bus in the word drive. By such an operation, a predetermined word line WL is selected.

The column control unit 23 includes a column decoder and a column switch. The column switch controls connection between the data line DL and the source line SL on the memory cell array 21 side and terminals (DL terminal and SL terminal) on the opposite side (the write drive 24 or the read determination circuit 25). When the column control unit 23 receives a signal specifying the read/write target memory cell MC, the column decoder selects the data line DL and the source line SL of the read/write target memory cell MC. Then, the column decoder conducts the column switch connected to the selected data line DL and the source line SL. With such an operation, the data line DL and the source line SL connected to the memory cell MC selected on the memory cell array 21 side are connected to terminals on the opposite side (the write drive 24 or the read determination circuit 25).

In this manner, a voltage is applied to the predetermined word line WL by the row control unit 22, and the data line DL and the source line SL are connected between the memory cell array 21 side and the opposite side (the write drive 24 or the read determination circuit 25) by the column control unit 23. As a result, a predetermined memory cell MC is selected, and reading and writing control of information is performed.

Data write control for a predetermined memory cell MC is performed as follows. First, when a voltage is applied to the word line WL connected to a write target memory cell MC by the row control unit 22, the transistor 11 in the selected memory cell MC turns on. Then, any of the data line DL and any of the source line SL on the memory cell array 21 side are connected to the data line DL and the source line SL of the write drive 24 by the column control unit 23, respectively.

In such a state, by setting the data line DL to a higher level than the source line SL by the write drive 24, the ferromagnetic element 12 of the selected memory cell MC enters a high resistance state. By setting the data line DL to a level lower than the source line SL by the write drive 24, the ferromagnetic element 12 of the selected memory cell MC enters a low resistance state. In this manner, the write drive 24 performs a process of writing information to the selected memory cell MC. Note that a relationship between a potential relationship between the data line DL and the source line SL and the resistance state (high resistance state/low resistance state) of the ferromagnetic element 12 is not limited to the above description. Since the resistance state of the ferromagnetic element 12 is determined by a connection relationship between the ferromagnetic element 12 and the data line DL and the source line SL, the relationship between the potential relationship between the data line DL and the source line SL and the resistance state (high resistance state/low resistance state) may be opposite to the above description.

Next, data read control from a predetermined memory cell MC will be described. When a voltage is applied to the word line WL connected to the write target memory cell MC by the row control unit 22, the transistor 11 in the selected memory cell MC turns on. Then, the column control unit 23 connects the input terminal of the measurement signal of the read determination circuit 25 and the data line DL connected to the memory cell MC selected in the memory cell array 21. An input terminal of the reference signal of the memory cell array 21 is connected to a reference signal generation unit 26.

In such a state, the read determination circuit 25 receives the measurement signal input from the selected memory cell MC and a reference signal input from the reference signal generation unit 26. The read determination circuit 25 compares the levels of the measurement signal and the reference signal, and determines the resistance state of the ferromagnetic element 12 of the memory cell MC according to the comparison result. As a result, the information stored in the memory cell MC can be read. Note that the read determination circuit 25 may acquire and compare either a voltage value or a current value.

Here, in the write operation and the read operation, optimal voltages (current) in the word line WL, the data line DL, and the source line SL are different. Therefore, it is necessary to design the transistors arranged around the memory cell array 21 separately for high voltage or low voltage so that a voltage (current) in an optimum range is used.

In this manner, the read determination circuit 25 is used to compare either the current value or the voltage value output from the memory cell MC with the reference value (reference current or reference voltage) to determine the resistance state of the memory cell MC. Hereinafter, a case where a current value is used is referred to as a current mode, and a case where a voltage value is used is referred to as a voltage mode. As an example of the configuration of the read determination circuit 25 in the current mode, a sense amplifier can be considered. For example, the sense amplifier outputs a high level/low level voltage according to a magnitude relationship between the current of the measurement signal and the current of the reference signal, received via an input terminal. As a result, the resistance state of the memory cell MC can be determined by the voltage level.

Figure 2B:
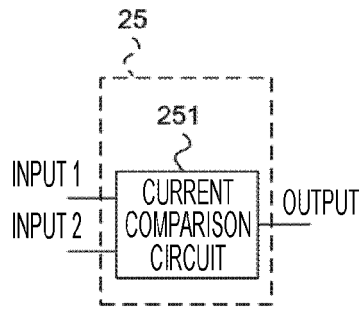
FIG. 2B is an example of a specific configuration of a read determination circuit.
Figure 2C:
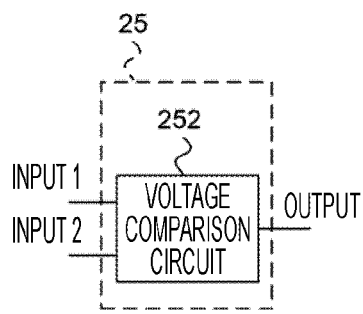
FIG. 2C is an example of the specific configuration of the read determination circuit.
Figure 2D:
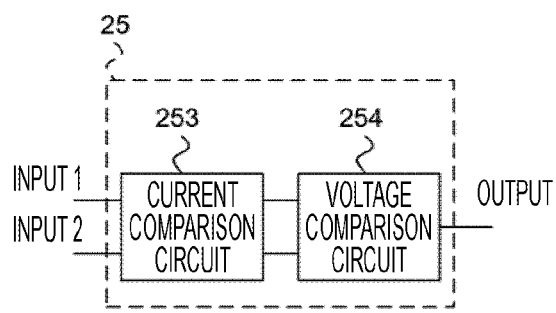
FIG. 2D is an example of the specific configuration of the read determination circuit.
Figure 2E:
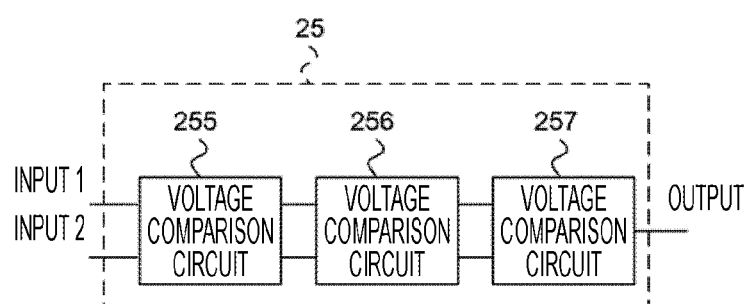
FIG. 2E is an example of the specific configuration of the read determination circuit.

The read determination circuit 25 is not limited to the sense amplifier, and may have, for example, a configuration as illustrated in FIGS. 2B to 2E. The read determination circuit 25 illustrated in FIGS. 2B and 2D is a circuit that is used in the current mode and compares the input current value, and the read determination circuit 25 illustrated in FIGS. 2C and 2E is a circuit that is used in the voltage mode and compares the input voltage value.

According to the configuration of FIG. 2B, the read determination circuit 25 may be a current comparison circuit 251. The current comparison circuit 251 compares the input current values of an input 1 and an input 2, and for example, in a case where the current value of the input 1 is larger than the current value of the input 2, a high-level voltage is output.

According to the configuration of FIG. 2C, the read determination circuit 25 may be a voltage comparison circuit 252. The voltage comparison circuit 252 compares the input voltage values of the input 1 and the input 2, and for example, in a case where the voltage value of the input 1 is larger than the voltage value of the input 2, a high-level voltage is output.

According to the configuration of FIG. 2D, the read determination circuit 25 is configured by connecting a current comparison circuit 253 and a voltage comparison circuit 254 in series. The current comparison circuit 253 outputs a voltage value maintaining a magnitude relationship to each of the two output terminals according to a current value input via the two input terminals. Then, the voltage comparison circuit 254 outputs a high level/low level voltage according to the magnitude relationship between the voltage values input via the two input terminals.

According to the configuration of FIG. 2E, the read determination circuit 25 is configured by connecting three voltage comparison circuits 255 to 257 in series. The voltage comparison circuits 255 and 256 each output a voltage value maintaining a magnitude relationship to each of the two output terminals according to a voltage value input via the two input terminals. Then, the voltage comparison circuit 257 outputs a high level/low level voltage according to the magnitude relationship between the voltage values input via the two input terminals.

As described above, the read determination circuit 25 illustrated in FIGS. 2D and 2E is configured by combining a plurality of stages of comparison circuits, and thus, as a determination circuit configuration for comparing and outputting two input values, improvement in comparison sensitivity, operation speed, power consumption, and the like, and optimization thereof can be achieved.

Figure 3:
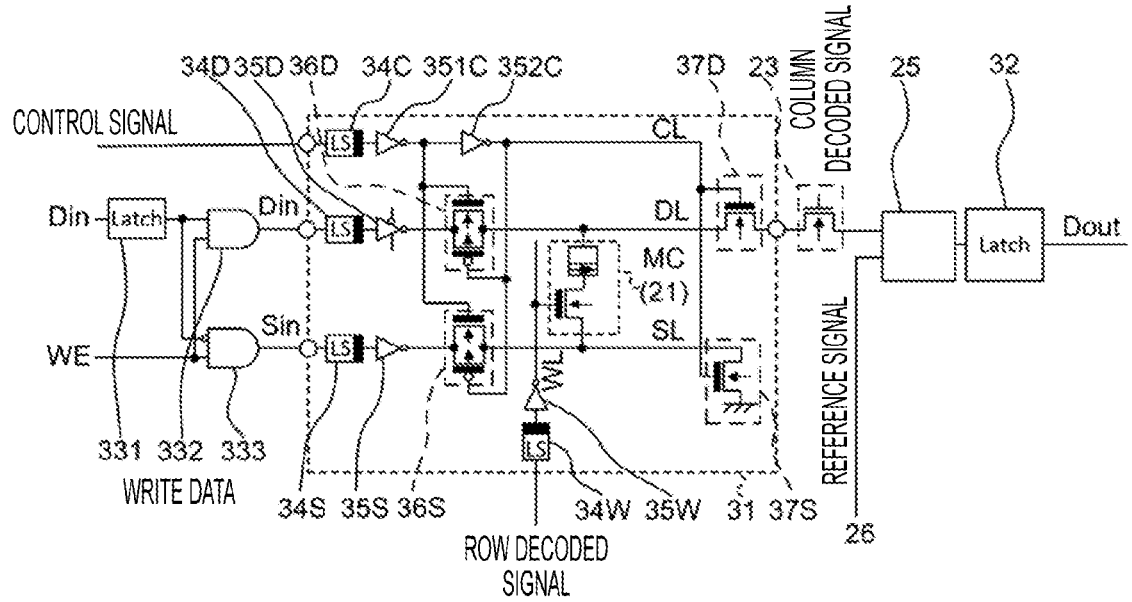
FIG. 3 is a schematic circuit configuration diagram around the memory cell array.

FIG. 3 is a schematic circuit configuration diagram around the memory cell array 21. In FIG. 3, one memory cell MC selected as the memory cell array 21 is representatively illustrated for readability. In addition, as described below, in a high withstand voltage element region 31 around the memory cell array 21 indicated by a dotted line, it is necessary to use a high voltage semiconductor element having high voltage resistance. A low voltage semiconductor element may be used outside the high withstand voltage element region 31. Note that the boundary between the high withstand voltage element region 31 in which the high voltage semiconductor element is used and the region in which the low voltage semiconductor element is used is determined by rational and efficient elements and the like from a circuit system, a circuit configuration, and the like, and is not limited to the example of FIG. 3.

On the right side in FIG. 3 of the high withstand voltage element region 31, a column switch of the column control unit 23 connected to an output terminal indicated by a white circle is provided. The connection between the data line DL connected to the selected memory cell MC and the input terminal of the measurement signal of the read determination circuit 25 is controlled by controlling the column control unit 23 (column switch). In addition, a latch circuit 32 is provided at an output end of the read determination circuit 25. The latch circuit 32 is a holding circuit provided to make the output result of the read determination circuit 25 available at a subsequent stage. In the example of FIG. 3, an amplifier is not provided, but an amplifier may be provided.

On the left side in FIG. 3 of the high withstand voltage element region 31, three terminals indicated by white circles, specifically, a reception terminal for the control signal and two write terminals used for write processing are provided. While the control terminal receives the control signal, data is read from the selected memory cell MC or data is written to the selected memory cell MC. Write data Din having passed through the configurations 331 to 333 and inverted data Sin of the write data Din are input to the two write terminals. At the time of data write processing, the resistance state of the ferromagnetic element 12 of the memory cell MC is changed according to inputs of these two write terminals.

Specifically, the latch circuit 331 and the two AND operators 332 and 333 are provided in a preceding stage (the left side in FIG. 3) of the two write terminals, and receive the input of the write data Din and a write permission signal WE. The AND operator 332 receives the write data Din and the write permission signal WE input via the latch circuit 331 and performs OR processing. By doing so, when the write permission signal WE is turned on, the write data Din is input to the data line DL.

The AND operator 333 receives the inverted write data Din and the write permission signal WE and performs the OR processing. By doing so, when the write permission signal WE is turned on, the inverted data Sin of the write data Din is input to the source line SL.

Inside the high withstand voltage element region 31, the data line DL is provided with a level shifter 34D, a controlled inverter 35D (clock inverter), and a control switch 36D. Since the level shifter 34D and the controlled inverter 35D are provided, it is possible to input a signal of an optimum level to the data line DL regardless of the magnitude of the write data Din and to suppress generation of a current in the reverse direction.

Similarly, the source line SL is provided with a level shifter 34S, an inverter 35S, and a control switch 36S. The word line WL is provided with a level shifter 34W and an inverter 35W.

On a control line CL to which the control signal is transmitted, a level shifter 34C and inverters 351C and 352C are provided. Here, the control switches 36D and 36S provided in the data line DL and the source line SL are configured by a combination of an N-type Metal-Oxide-Semiconductor Field Effect Transistor (MOSFET) that is turned on when a positive voltage is applied to the gate and a P-type MOSFET that is turned on when a negative voltage is applied to the gate. The control signal output from the inverter 351C is input to the N-type MOSFET, and the control signal output from the inverter 352C is inverted and input to the P-type MOSFET, whereby the control switches 36D and 36S are conducted when the control signal is at the high level.

Further, a transistor switch 37D is provided between the data line DL and the column control unit 23, and a transistor switch 37S is provided at a ground end of the source line SL. The transistor switches 37D and 37S are controlled by a control signal output from the inverter 352C. Then, in a case where the control signal is turned on, the measurement signal is input to the input terminal of the measurement signal of the read determination circuit 25 via the column control unit 23. Therefore, the read determination circuit 25 compares the measurement signal with the reference signal, so that information reading processing can be performed.

Here, focusing on the configuration of the high withstand voltage element region 31, it is necessary to use the level shifters 34D, 34S, 34C, and 34W in order to match the levels of the data line DL, the source line SL, the word line WL, and the control line CL. In the high withstand voltage element region 31, since the voltage level is increased by the level shifters 34D, 34S, 34C, and 34W, it is necessary to use a high voltage component for the semiconductor element. Meanwhile, a low-voltage semiconductor element may be used outside the high withstand voltage element region 31. As described above, it is necessary to design the overall size and operation characteristics of the semiconductor memory device according to the arrangement of the level shifters 34.

Figure 4:
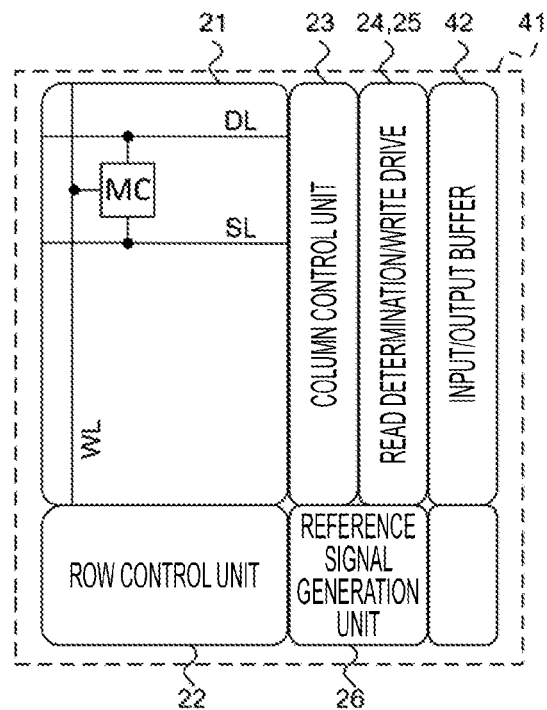
FIG. 4 is a schematic configuration diagram of the semiconductor memory device.

FIG. 4 is a schematic configuration diagram of a semiconductor memory device. The semiconductor memory device 41 includes the memory cell array 21, the row control unit 22, the column control unit 23, the write drive 24, the read determination circuit 25, the reference signal generation unit 26, and an input/output buffer 42. The input/output buffer 42 temporarily stores input/output data to be exchanged with a host controller that controls the entire semiconductor memory device 41. As described above, the row control unit 22 includes the row decoder and the word drive, and the column control unit 23 includes the column decoder and the column switch.

Here, the storage content of the memory cell MC is read by determining whether the ferromagnetic element 12 of the memory cell MC is in the low resistance state or the high resistance state. However, when the resistance value of the ferromagnetic element 12 is measured to determine the resistance state, it is necessary to consider a wiring parasitic resistance according to the arrangement of the selected memory cell MC in the memory cell array 21.

Figure 5:
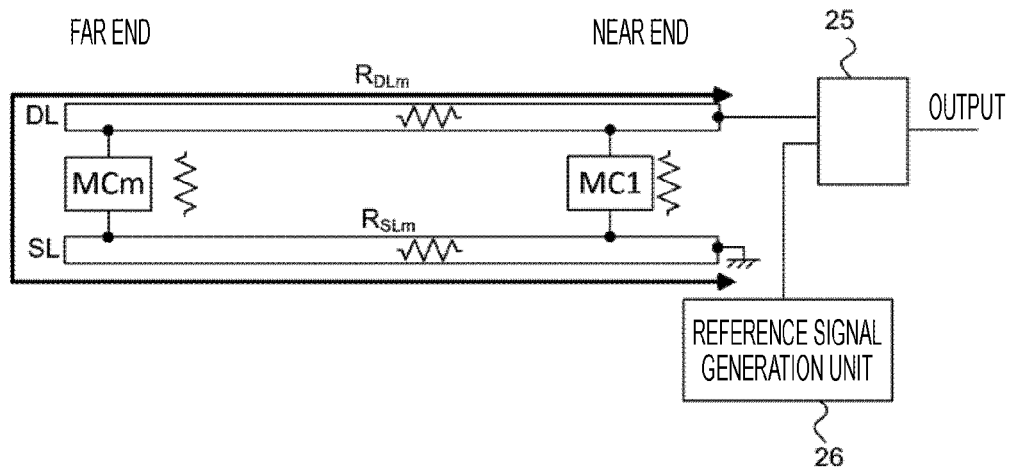
FIG. 5 is a schematic circuit configuration diagram around the read determination circuit.

FIG. 5 is a schematic circuit configuration diagram around the read determination circuit 25. In FIG. 5, a memory cell MC1 in a first row at an end (near end) closest to the read determination circuit and a memory cell MCm in the mth row at an end (far end) farthest from the read determination circuit 25 are illustrated as representative examples.

As indicated by a thick arrow, at the time of reading the memory cell MCm at the far end, a current flows from the read determination circuit 25 to the wiring to a grounding portion at the near end of the source line SL via the data line DL and the memory cell MCm. That is, a sum "$R_{DLm}+R_{SLm}$" of a resistance value $R_{DLm}$ from the near end to the memory cell MCm at the far end of the data line DL and a resistance value $R_{SLm}$ from the near end to the memory cell MCm at the far end of the source line SL becomes the wiring parasitic resistance.

Here, at the time of reading the memory cell MCm, a measured resistance value $R_{MC}$ is obtained from the read current by the read determination circuit 25, and it is determined whether the memory cell MC is in the high resistance state or the low resistance state. However, in the evaluation of the resistance value R of the ferromagnetic element 12, the measured resistance value $R_{MC}$ includes not only the resistance value of the ferromagnetic element 12 but also the wiring parasitic resistance "$R_{DL}+R_{SL}$".

Furthermore, at the time of measurement of the memory cell MC1 at the near end, the wiring parasitic resistances of the data line DL and the source line SL become zero. As described above, since the magnitude of the wiring parasitic resistance varies depending on the arrangement of the memory cell MC, there is a possibility that the resistance state of the memory cell MC cannot be appropriately determined.

Figure 6:
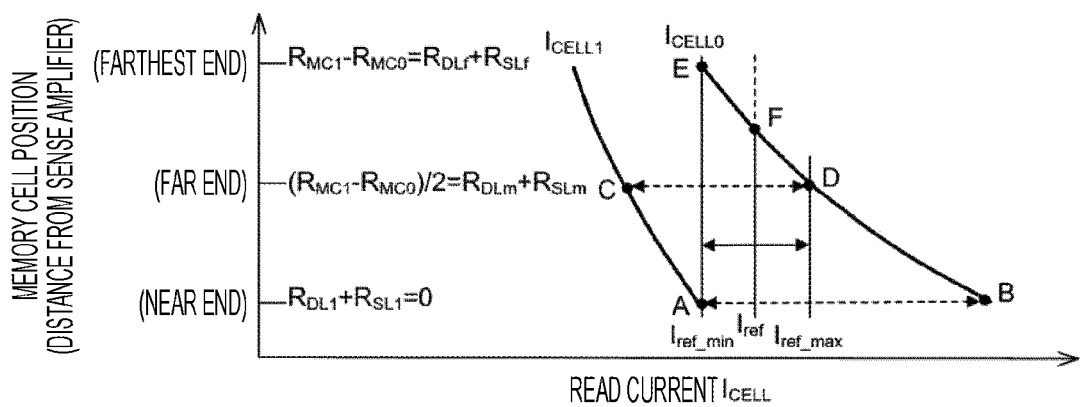
FIG. 6 is a graph illustrating a relationship between a read current and a position of a selected memory cell.

FIG. 6 is a graph illustrating a relationship between the read current input to the read determination circuit 25 and the position of the selected memory cell MC in the current mode. FIG. 6 illustrates a relationship between a current value $I_{CELL}$ input to the read determination circuit 25 and a distance of the selected memory cell MC from the read determination circuit 25 at the time of reading the memory cell MC.

A horizontal axis indicates the current value $I_{CELL}$ input to the read determination circuit 25. A vertical axis indicates the distance of the reading target memory cell MC from the read determination circuit 25. In the vertical axis, the near end in FIG. 5 corresponds to a lower step, and the far end in FIG. 5 corresponds to a middle step. In an upper step, the farthest end of the arrangement of the theoretically readable memory cells MC is illustrated.

In this graph, the current value input to the read determination circuit 25 when the selected memory cell MC is in the high resistance state is indicated by $I_{CELL1}$, and the current value when the selected memory cell MC is in the low resistance state is indicated by $I_{CELL0}$. Since the current value is inversely proportional to the resistance value, the current value $I_{CELL1}$ in the high resistance state is smaller than the current value $I_{CELL0}$ in the low resistance state as a whole. Since the wiring parasitic resistance increases as the distance from the read determination circuit 25 increases (the upper side in FIG. 6), the current value $I_{CELL1}$ in the high resistance state and the current value $I_{CELL0}$ in the low resistance state decrease as the distance from the read determination circuit 25 increases.

Here, the resistance state of the memory cell MC is determined based on whether the read current value $I_{CELL}$ is larger than a reference current $I_{ref}$. Therefore, for example, at the near end, the reference current $I_{ref}$ needs to be between the current value $I_{CELL1}$ (point A) in the high resistance state and the current value $I_{CELL0}$ (point B) in the low resistance state. Similarly, at the far end, the reference current $I_{ref}$ needs to be between the current value $I_{CELL1}$ in the high resistance state (point C) and the current value $I_{CELL0}$ in the low resistance state (point D).

When the resistance state of the memory cell MC is determined using the same reference current $I_{ref}$, the arrangement position (farthest end) of the theoretically farthest memory cell MC is determined as follows. In the arrangement of any memory cell MC, the reference current $I_{ref}$ needs to be a value between the current value $I_{CELL1}$ in the high resistance state and the current value $I_{CELL0}$ in the low resistance state. Therefore, the current value $I_{CELL1}$ (point A) in the high resistance state at the near end needs to be smaller than the theoretically readable current value $I_{CELL0}$ (point E) in the low resistance state at the farthest end. When the memory cell MC is arranged farther than (above the point E) the position determined in this manner, the current value $I_{CELL0}$ in the low resistance state becomes smaller than the current value $I_{CELL1}$ in the high resistance state at the near end, and the resistance state cannot be determined using the same reference current $I_{ref}$.

When the resistance state is determined using the same reference current $I_{ref}$, "$R_{DLf}+R_{DSf}$" equal to "$R_{MC1}-R_{MC0}$" is the farthest end (theoretical farthest end) in the ideal state. When the resistance state is determined using the same reference current $I_{ref}$, "$R_{DLf}+R_{DSf}$" is the wiring parasitic resistance at the farthest end that can be logically designed.

Furthermore, in order to stably read the memory cell MC, the wiring parasitic resistance "$R_{SL}+R_{SL}$" is desirably about half the difference "$R_{MC1}-R_{MC0}$" between the high resistance state and the low resistance state of the measured resistance value $R_{MC}$. Therefore, a position of "$(R_{MC1}-R_{MC0})/2=R_{DLm}+R_{SLm}$" is defined as the far end on which the memory cell MC can be arranged. Note that, since the wiring parasitic resistance can be regarded as zero at the near end, "$R_{DL1}+R_{SL1}=0$" is established.

Here, an upper limit and a lower limit of the reference current $I_{ref}$ are considered as follows. For the memory cell MC arranged at the near end, in order to determine the current value $I_{CELL1}$ (point A) in the high resistance state and the current value $I_{CELL0}$ (point B) in the low resistance state, the reference current $I_{ref}$ needs to exist between points A and B. In addition, in the memory cell arranged at the far end, in order to determine the current value $I_{CELL1}$ (point C) in the high resistance state and the current value $I_{CELL0}$ (point D) in the low resistance state, the reference current $I_{ref}$ needs to exist between points C and D.

Therefore, in order to determine the resistance state of the memory cells MC arranged in parallel between the near end and the far end, the upper limit reference current $I_{ref\_max}$ is determined by the point D, and the lower limit reference current $I_{ref\_min}$ is determined by the point A. Then, an intermediate value between the upper limit reference current $I_{ref}$ max and the lower limit reference current $I_{ref\_min}$ is determined as the reference current $I_{ref}$ used for determining the resistance state.

As a result, the reference current $I_{ref}$ is located between the current value $I_{CELL1}$ in the high resistance state and the current value $I_{CELL0}$ in the low resistance state, so that the difference between the reference current $I_{ref}$ and the current value $I_{CELL1}$ in the high resistance state and the current value $I_{CELL0}$ in the low resistance state is larger than a predetermined value ("$I_{ref\_max}-I_{ref}$" or "$I_{ref}-I_{ref\_min}$") regardless of the distance from the read determination circuit 25. As a result, it is possible to improve the accuracy in the determination of the resistance state of the memory cell MC.

Note that, when a case where the memory cells MC are arranged beyond the far end to the farthest end by using the reference current $I_{ref}$ determined in this manner is considered, the case is as follows. The resistance state can be determined for the memory cell MC arranged up to a distance corresponding to a point F where the reference current $I_{ref}$ and the current value $I_{CELL0}$ in the low resistance state match. However, since the reference current $I_{ref}$ exceeds the current value $I_{CELL1}$ in the high resistance state and the current value $I_{CELL0}$ in the low resistance state for the memory cell MC arranged at the point F or more, the resistance state cannot be determined.

Figure 7:
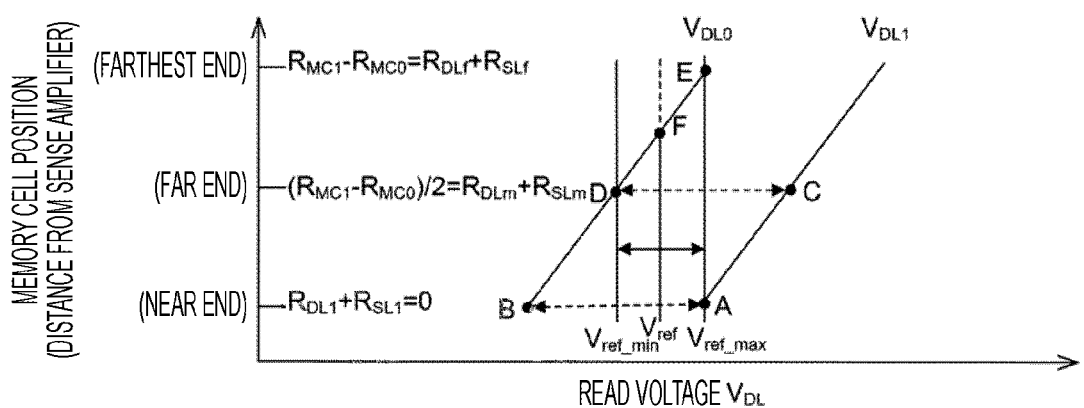
FIG. 7 is a graph illustrating a relationship between a read voltage and a position of a selected memory cell.

FIG. 7 is a graph illustrating a relationship between the read voltage and the position of the selected memory cell MC in the voltage mode. FIG. 7 corresponds to the graph illustrated in FIG. 6, and illustrates an example in which the read determination circuit 25 reads the voltage value instead of the current value. A horizontal axis indicates the voltage value $V_{DL}$ of the data line DL input to the read determination circuit 25 instead of the current value $I_{CELL}$ input to the read determination circuit 25. The reference signal used in the read determination circuit 25 is a reference voltage $V_{ref}$.

As illustrated in FIG. 7, since the voltage value $V_{DL}$ is a value corresponding to the resistance value, the voltage value $V_{DL1}$ in the high resistance state is larger than the voltage value $V_{DL0}$ in the low resistance state as a whole. In addition, as the distance from the read determination circuit 25 increases, the wiring parasitic resistance increases, and the voltage value $V_{DL1}$ in the high resistance state and the voltage value $V_{DL0}$ in the low resistance state increase.

Similarly, the upper limit and the lower limit of the reference voltage $V_{ref}$ are examined as follows. In the memory cell MC arranged at the near end, in order to determine the voltage value $V_{DL1}$ (point A) in the high resistance state and the voltage value $V_{DL0}$ (point B) in the low resistance state, the reference voltage $V_{ref}$ needs to exist between points A and B. In addition, in the memory cell MC arranged at the far end, in order to determine the voltage value $V_{DL1}$ (point C) in the high resistance state and the voltage value $V_{DL0}$ (point D) in the low resistance state, the reference voltage $V_{ref}$ needs to exist between points C and D.

Therefore, in order to determine the resistance state of the memory cells MC arranged in parallel between the near end and the far end, an upper limit reference voltage $V_{ref\_max}$ is determined by point A, and a lower limit reference voltage $V_{ref\_min}$ is determined by point D. In addition, an intermediate value between the upper limit reference voltage $V_{ref\_max}$ and the lower limit reference voltage $V_{ref\_min}$ is used as the reference voltage $V_{ref}$.

A case where the memory cells MC are arranged beyond the far end to the farthest end will be studied as follows. The resistance state can be determined for the memory cell MC arranged up to a distance determined by an intersection F between the reference voltage $V_{ref}$ and the voltage value $V_{DL0}$ in the high resistance state. However, since the reference voltage $V_{ref}$ is lower than the voltage value $V_{DL1}$ in the high resistance state and the voltage value $V_{DL0}$ in the low resistance state for the memory cell MC arranged beyond the point F, the resistance state cannot be determined.

The above is the description of the read processing of the memory cell MC in the comparative example. According to embodiments of the present invention described below, a reference signal correction unit is provided in order to reduce the influences of the wiring parasitic resistances of the data line DL and the source line SL. As a result, the resistance state of the memory cell MC arranged farther from the read determination circuit 25 can be determined.

First Embodiment

In the comparative example, as illustrated in FIGS. 6 and 7, the memory cell MC can be arranged only up to the far end in the middle stage, and cannot be arranged up to the farthest end in the upper stage. In a first embodiment, by providing the reference signal correction unit, the memory cell MC can be arranged up to the farthest end of the upper stage in the comparative example. Note that since the semiconductor memory device according to the present embodiment has a basic configuration substantially equivalent to that of the semiconductor memory device 41 described in the comparative example, the semiconductor memory device 41 illustrated in FIG. 4 will be described below as the semiconductor memory device 41 according to the present embodiment, mainly focusing on the circuit configuration around the read determination circuit 25 provided in the semiconductor memory device 41.

Figure 8:
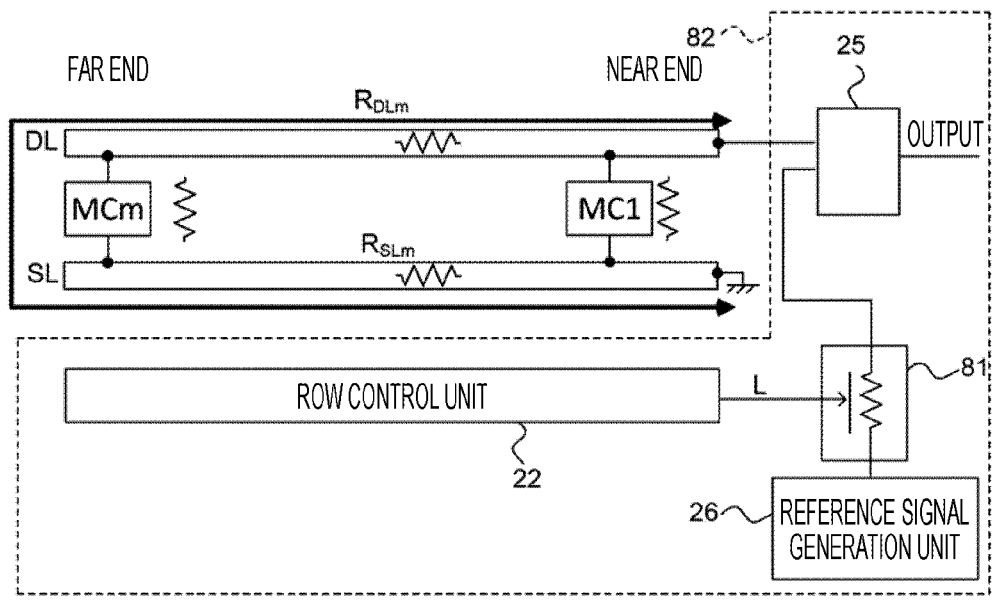
FIG. 8 is a schematic circuit configuration diagram around a read determination circuit according to a first embodiment.

FIG. 8 is a schematic circuit configuration diagram around the read determination circuit 25 in the semiconductor memory device 41 according to the first embodiment. According to FIG. 8, as compared with the configuration of the comparative example illustrated in FIG. 5, a variable resistance unit 81 that is a reference signal correction unit is provided. As described later, since the memory cell MC can be arranged up to the farthest end in the comparative example illustrated in FIG. 7, the far end of the present embodiment corresponds to the farthest end of the comparative example. In addition, the illustrated example is assumed to operate in a current mode. That is, the read determination circuit 25 outputs the high level/low level current value according to the magnitude relationship between the input currents input from the two input terminals.

When receiving the position information (selected position information) L of the selected memory cell MC, the variable resistance unit 81 changes the resistance value according to the position of the selected memory cell MC indicated by the selected position information L. The selected position information L is, for example, information indicating the word line WL. The resistance value of the variable resistance unit 81 changes so as to increase as the distance from the read determination circuit 25 to the selected memory cell MC is longer. The selected position information L is, for example, an address signal of the word line WL used for the control of the row control unit 22.

Note that all or some of the configurations other than the memory cell, that is, the row control unit 22, the read determination circuit 25, the reference signal generation unit 26, the variable resistance unit 81, and other configurations related to control may be realized by one control device 82. Note that the control device 82 includes, for example, a general-purpose microcomputer including a central processing unit (CPU), a memory, and an input/output unit, and can be realized by controlling electronic components of the read determination circuit 25 and the variable resistance unit 81. In order to cause the microcomputer to function as a controller of an electronic component, a computer program (control program) is installed and executed in the microcomputer. As a result, the general-purpose microcomputer functions as a controller that executes a predetermined program in the control device 82.

Figure 9:
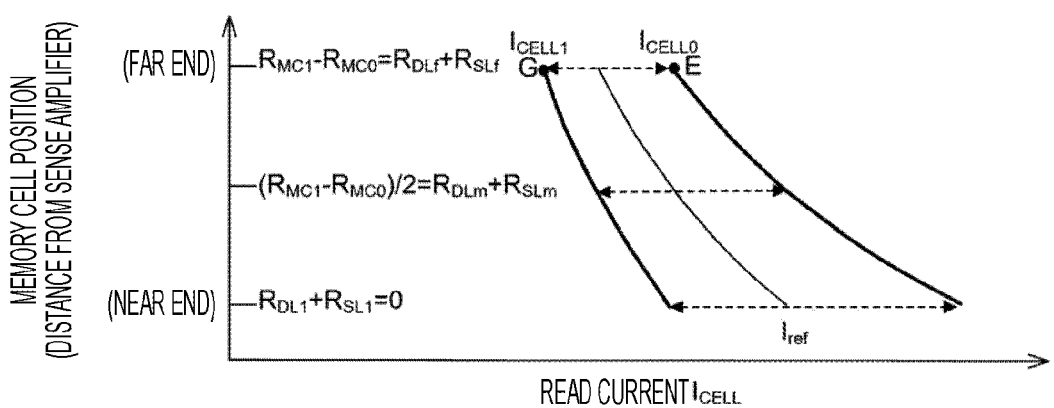
FIG. 9 is a graph illustrating a relationship between the read current and a position of a selected memory cell.

FIG. 9 is a graph illustrating the relationship between the read current input to the read determination circuit 25 and the position of the selected memory cell MC, and corresponds to FIG. 6 of the comparative example. In FIG. 9, the position shown as the farthest end in FIG. 6 in the upper stage is shown as the far end. This is because the memory cell MC can be read at the position in the present embodiment.

As illustrated in FIG. 9, the reference current $I_{ref}$ changes in magnitude according to the distance from the read determination circuit 25 so as to be an intermediate value between the current value $I_{CELL1}$ in the high resistance state and the current value $I_{CELL0}$ in the low resistance state. This is because the resistance value of the variable resistance unit 81 changes so that the reference current $I_{ref}$ becomes this intermediate value.

By setting the reference current $I_{ref}$ in this manner, the reference current $I_{ref}$ is located between the current value $I_{CELL1}$ (point G) in the high resistance state and the current value $I_{CELL0}$ (point E) in the low resistance state even at a position corresponding to the far end illustrated in the upper stage, that is, the farthest end of the comparative example. Therefore, the resistance state of the memory cell MC can be determined by comparing the read current value $I_{CELL}$ with the reference current $I_{ref}$.

As a result, since the memory cell MC can be arranged farther from the read determination circuit 25, the restriction on the arrangement of the memory cells MC due to the wiring parasitic resistance ($R_{DL}$) of the data line DL and the wiring parasitic resistance ($R_{SL}$) of the source line SL can be reduced. Specifically, the memory cell MC can be arranged even at the farthest end (corresponding to the far end in FIG. 9) in FIG. 6 where the memory cell MC cannot be arranged in the comparative example, and the area of the memory cell array can be expanded.

Furthermore, since the reference current $I_{ref}$ is located between the current value $I_{CELL1}$ in the high resistance state and the current value $I_{CELL0}$ in the low resistance state, the difference between the reference current $I_{ref}$ and the current value $I_{CELL1}$ in the high resistance state and the current value $I_{CELL0}$ in the low resistance state becomes constant regardless of the distance from the read determination circuit 25. As a result, it is possible to improve the accuracy in the determination of the resistance state of the memory cell MC.

In the present embodiment, an example has been described in which the read determination circuit 25 operates in the current mode and determines the magnitude relationship between the output current from the memory cell MC and the reference current in order to determine the resistance state of the memory cell MC. Specifically, as the read determination circuit 25, the example in which the read determination circuit 25 including the current comparison circuit 251 as illustrated in FIG. 2B or the read determination circuit 25 having a two-stage configuration as illustrated in FIG. 2D is applied has been described. In such a configuration, the value of the reference current input to the read determination circuit 25 is changed by the variable resistance unit 81.

The present invention is not limited to such a configuration, and the read determination circuit 25 may operate in the voltage mode and determine the magnitude relationship between the output voltage from the memory cell MC and the reference voltage in order to determine the resistance state of the memory cell MC. Specifically, as the read determination circuit 25, as illustrated in FIG. 2C, the read determination circuit 25 including the voltage comparison circuit 252 or the read determination circuit 25 having a three-stage configuration as illustrated in FIG. 2E may be applied. In such a configuration, the reference voltage input to the read determination circuit 25 is changed.

Furthermore, in the current mode, the variable resistance unit 81 may be configured integrally with the read determination circuit 25 by being arranged inside the read determination circuit 25. That is, in the example of FIG. 2B, it can be configured integrally with the current comparison circuit 251, and in the example of FIG. 2D, it can be configured integrally with the current comparison circuit 253 connected to the input terminal. Furthermore, in the voltage mode, the configuration for changing the reference voltage input to the read determination circuit 25 may be integrated with the voltage comparison circuit 252 in the example of FIG. 2C, and may be integrated with the voltage comparison circuit 255 connected to the input terminal in the example of FIG. 2E.

Second Embodiment

In the first embodiment, as illustrated in FIG. 8, the address signal specifying the position of the word line WD is used as the selected position information L used for controlling the variable resistance unit 81. However, in order to use this address signal, a configuration including an address bus equivalent to the word drive of the row control unit 22 as a generation source of the selected position information L is required, and the wiring and the circuit scale become large. Therefore, in a second embodiment, the memory cell array 21 is divided into a plurality of regions, and the resistance value of the variable resistance unit 81 is switched in stages according to the region including the selected memory cell MC, thereby simplifying the generation source of the selected position information L and the configuration of the variable resistance unit 81.

Figure 10:
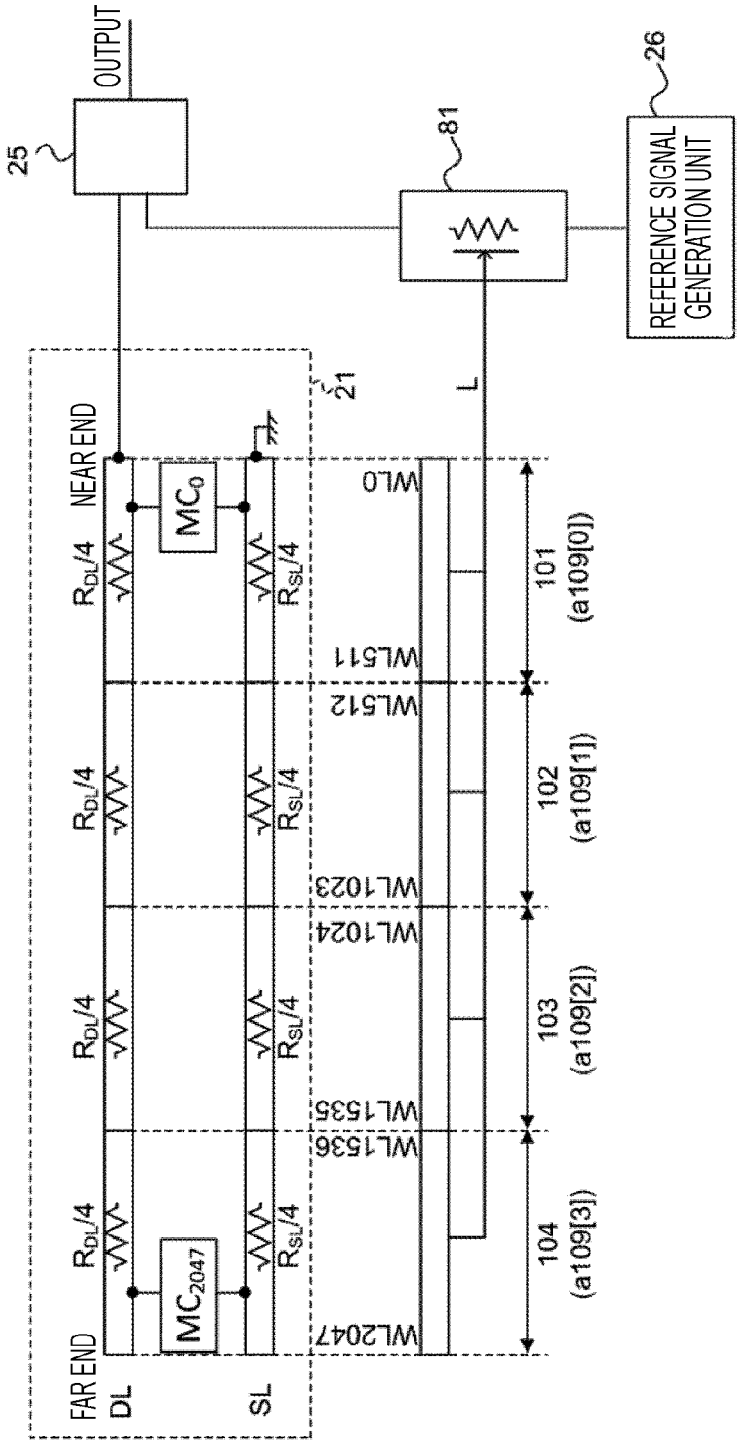
FIG. 10 is a schematic circuit configuration diagram around a read determination circuit according to a second embodiment.

FIG. 10 is a schematic circuit configuration diagram around the read determination circuit 25 according to the second embodiment. According to FIG. 10, the memory cell array 21 is divided into four regions, and the resistance value of the variable resistance unit 81 is changed according to the region where the selected memory cell MC exists. A method of selecting a region will be described with reference to FIGS. 11 and 12, and a configuration of variable resistance unit 81 will be described with reference to FIG. 13.

In this example, in the memory cell array 21, 2048 memory cells MC are arranged in the column direction, and word lines WL (WL0 to WL2047) connected to the respective memory cells MC are provided. The numbers assigned to the word lines WL increase from a near end side toward a far end side.

Then, an arrangement region of the memory cell MC is divided into four regions 101 to 104 in the column direction. A first region 101 includes the word lines WL0 to WL511, a second region 102 includes the word lines WL512 to WL1023, a third region 103 includes the word lines WL1024 to WL1535, and a fourth region 104 includes the word lines WL1536 to WL2047.

The wiring parasitic resistances of the data line DL and the source line SL are "$R_{SL}/4$" and "$R_{SL}/4$" in each of the four regions 101 to 104. Note that a109[0] to a109[3] indicated corresponding to the regions 101 to 104 are address buses used for selecting the regions 101 to 104, and the details will be described with reference to FIGS. 11 and 12.

Here, when the memory cell MC is selected, in the row control unit 22 (not illustrated in FIG. 10), the row decoder selects the word line WL connected to the selected memory cell MC uniquely determined based on the corresponding address input signal, and the voltage is applied from the word drive corresponding to the word line WL. A series of processing by such a row decoder is referred to as decoding processing.

In the present embodiment, a part of the signal (pre-decoded signal) generated in the decoding processing is used as the signal for selecting one of the regions 101 to 104. Specifically, the resistance value of the variable resistance unit 81 is controlled using a part of the information (pre-decoded signal) from the circuit obtained by hierarchically dividing the decoding processing as the selected position information L. Hereinafter, processing using such a pre-decoded signal will be described with reference to FIGS. 11 to 13.

Figures 11, 12:
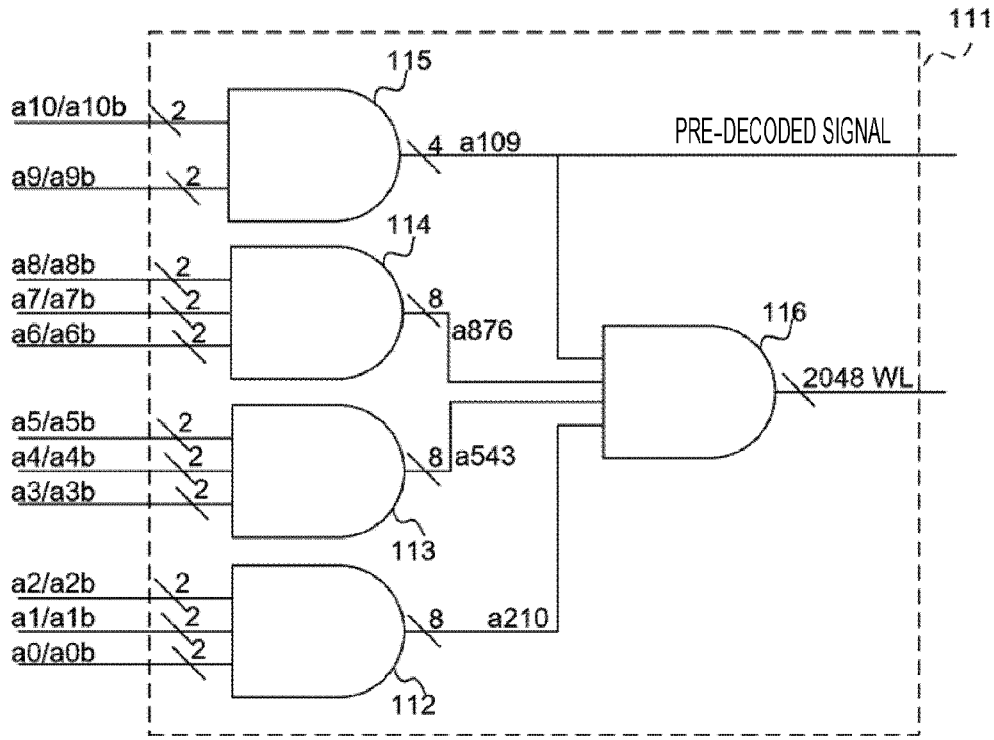
FIG. 11 is a logic circuit of a row decoder.
FIG. 12 is a logical correspondence table illustrating a relationship between a region in which word lines are arranged and input/output of a row decoder.

FIG. 11 is a logic circuit of a row decoder. In the row decoder 111, the word line WL connected to the selected memory cell MC is determined according to the input values from the address buses a0 to a10 of the host control unit. Note that, in FIG. 11, the host control unit includes complementary address signals a0b to a10b in addition to the address buses a0 to a10, but description of operations of the complementary address signals a0b to a10b will be omitted below.

The row decoder 111 is a circuit that generates a signal uniquely selecting one word line from 2048 of all combinations ($2^{11}$) of the address signals a0 to a10 having two values of high level (H)/low level (L). This circuit is divided into two layers including AND operators 112 to 116.

A three-input AND operator 112 in the first layer is required to correspond to all combinations (2×2×2) of inputs of addresses a0/a0b to a2/a2b, so that eight input AND operators are required, and eight signals are also output. The operator 113 and the operator 114 have the same configuration. Since a two-input AND operator 115 corresponds to all the combinations (2×2) of the inputs of the addresses a9/a9b to a10/a10b, so that four input AND operators are required, and four signals are also output.

The number of four-input AND operators 116 in the second layer is 2048 according to all combinations (8×8×8×4) of the input signals. By this decoding processing, the word line can be uniquely selected.

Here, a109 (pre-decoded signal) output from the operator 115 is used for control of the variable resistance unit 81 as the selected position information L. A relationship illustrated in FIG. 12 holds for the parameter a109 (pre-decoded signal) output from the operator 115.

FIG. 12 is a logical correspondence table illustrating a relationship between the regions 101 to 104 in which the selected word line WL is arranged and the input/output of the row decoder 111. In this table, the logical relationship between the address bus on the input side of the row decoder 111 and the selected word line WL is illustrated. Note that one of the regions 101 to 104 is selected using the four signals a109[0] to a109[3] output from the AND operator 115.

In a case where the fourth region 104 is selected, a10 is at a high level and a9 is at a high level at the input of the AND operator 115. a8 to a0 are levels indicating the arrangement of the selected memory cell MC in the fourth region 104. In such a case, in a109 output from the AND operator 115, a109[3] becomes the high level, and the others (a109[0] to a109[2]) become the low level.

In a case where the third region 103 is selected, a10 becomes a high level and a9 becomes a low level at the input of the AND operator 115. In such a case, a109[2] becomes the high level, and the others (a109[0], a109[1], and a109[3]) become the low level.

In a case where the second region 102 is selected, a10 becomes the low level and a9 becomes the high level at the input of the AND operator 115. In such a case, a109[1] becomes the high level, and the others (a109[0], a109[2], and a109[3]) become the low level.

In a case where the first region 101 is selected, a10 becomes the low level and a9 becomes the low level at the input of the AND operator 115. In such a case, a109[0] becomes the high level, and the others (a109[1] to a109[3]) become the low level.

Thus, 4-bit information of a109[0] to a109[3] output from the AND operator 115 corresponds to the regions 101 to 104. Therefore, the variable resistance unit 81 receives a109[0] to a109[3] as the selected position information L, and the resistance value of the variable resistance unit 81 is controlled according to the selected position information L.

Figure 13:
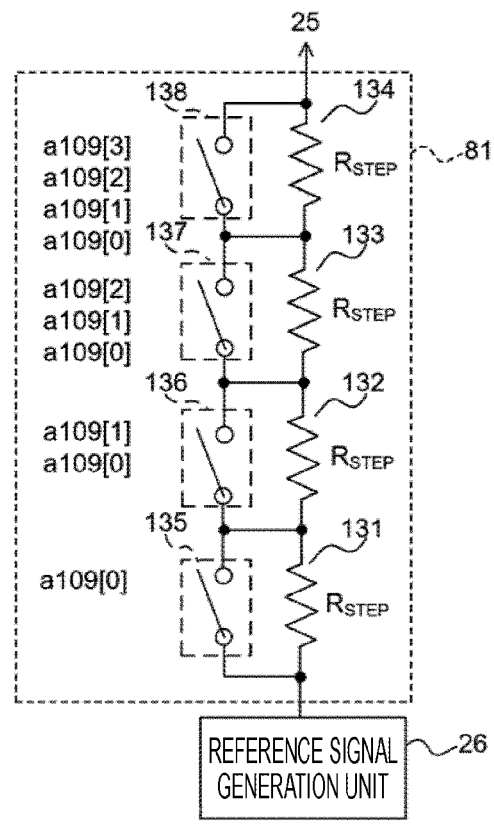
FIG. 13 is a detailed circuit configuration diagram of a variable resistance unit.

FIG. 13 is a detailed circuit configuration diagram of the variable resistance unit 81. According to FIG. 13, four resistance elements 131 to 134 are connected in series, and switches 135 to 138 are provided in parallel to the resistance elements 131 to 134. The resistance value $R_{STEP}$ of the resistance element 131 to 134 is a value "$(R_{DL}+R_{SL})/4$" obtained by dividing the sum of a data line parasitic resistance $R_{DL}$ and a source line parasitic resistance $R_{SL}$ by 4.

Here, the switches 135 to 138 are processed according to 4-bit information included in a109 output from the AND operator 115. Specifically, when a109 [0] is at the high level, the switches 135 to 138 are turned on. When a109[1] is at a high level, the switches 136 to 138 are turned on, and the switch 135 is turned off. When a109[2] is at a high level, the switches 137 and 138 are turned on, and the switches 135 and 136 are turned off. When a109[3] is at a high level, the switch 138 is turned on, and the switches 135 to 137 are turned off.

When a109[0] is at the high level, that is, when the selected memory cell MC is included in the first region 101, the switches 135 to 138 are turned on. In such a case, the reference signal is input to the read determination circuit 25 without passing through the resistance elements 131 to 134. Therefore, the entire resistance value of the variable resistance unit 81 becomes 0.

When a109[1] is at the high level, that is, when the selected memory cell MC is included in the second region 102, the switches 136 to 138 are turned on. In such a case, the reference signal is input to the read determination circuit 25 through the resistance element 131 without passing through the resistance elements 132 to 134. Therefore, the entire resistance value of the variable resistance unit 81 is "$R_{STEP}$".

When a109[2] is at the high level, that is, when the selected memory cell MC is included in the third region 103, the switches 137 and 138 are turned on. In such a case, the reference signal is input to the read determination circuit 25 through the resistance elements 131 and 132 without passing through the resistance elements 133 and 134. Therefore, the entire resistance value of variable resistance unit 81 is "$2R_{STEP}$".

When a109[3] is at the high level, that is, when the selected memory cell MC is included in the fourth region 104, the switch 138 is turned on. In such a case, the reference signal is input to the read determination circuit 25 through the resistance elements 131 to 133 without passing through the resistance element 134. Therefore, the entire resistance value of variable resistance unit 81 is "$3R_{STEP}$".

Here, as the resistance value of the variable resistance unit 81 increases, the reference current $I_{ref}$ decreases and the reference voltage $V_{ref}$ increases. Therefore, when the selected memory cell MC is located in the first region 101, the resistance value is large, the reference current $I_{ref}$ is small, and the reference voltage $V_{ref}$ is large. When the selected memory cell MC is located in the fourth region 104, the resistance value is small, the reference current $I_{ref}$ is large, and the reference voltage $V_{ref}$ is small.

The selected position information L received by the variable resistance unit 81 is not 2048 kinds of values of the word line WL0 to 2047 as in the first embodiment, but four kinds of values of a109[0] to a109[3], and the resistance value of the variable resistance unit 81 is controlled in four stages. Therefore, information on the address bus used for controlling the variable resistance unit 81 is reduced, and the configurations of the variable resistance unit 81 and a peripheral circuit thereof can be simplified.

Note that the variable resistance unit 81 is not limited to the configuration in which the plurality of resistance elements 131 to 134 is connected in series as illustrated in FIG. 13, and may be configured by a resistance element capable of realizing equivalent resistance change or a circuit capable of performing equivalent correction on the reference signal.

Figure 14:
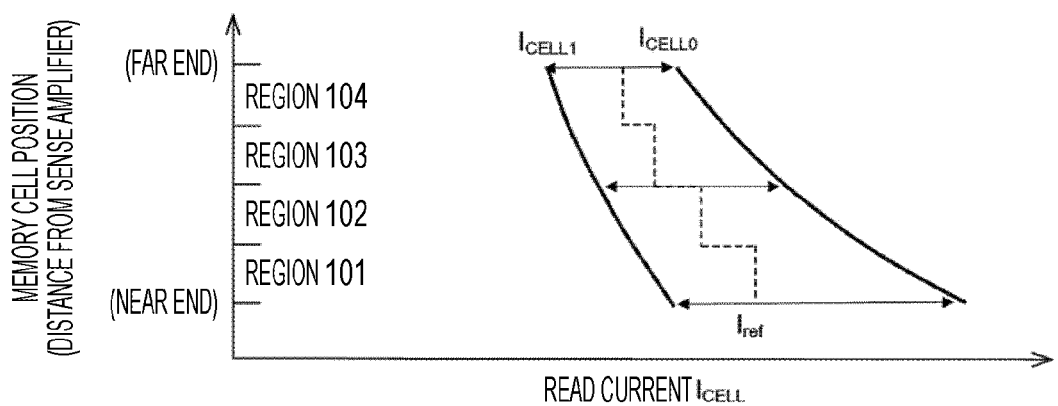
FIG. 14 is a graph illustrating a relationship between a read current and a position of a selected memory cell.

FIG. 14 is a graph illustrating the relationship between the read current input to the read determination circuit 25 and the position of the selected memory cell MC in the current mode, and corresponds to FIG. 6 of the comparative example and FIG. 9 of the first embodiment.

When the selected memory cell MC is included in any region of the regions 101 to 104, the reference current $I_{ref}$ is constant in the region. Furthermore, the reference current $I_{ref}$ in the same region decreases in the order of the first region 101, the second region 102, the third region 103, and the fourth region 104. This is because the resistance value of the variable resistance unit 81 is small when the selected memory cell MC is included in the first region 101, and the resistance value of the variable resistance unit 81 is large when the selected memory cell MC is included in the fourth region 104.

In this manner, the pre-decoded signal output from the AND operator 115 of the row decoder 111 is used for correction of the reference current $I_{ref}$ as the selected position information L indicating the region including the selected memory cell MC. The reference current $I_{ref}$ obtained in this manner is present between the current value $I_{CELL1}$ in the high resistance state and the current value $I_{CELL0}$ in the low resistance state in any of the first region 101 to the fourth region 104. Therefore, the resistance state of the memory cell MC can be determined by comparing the read current value $I_{CELL}$ with the reference current $I_{ref}$.

Figure 15:
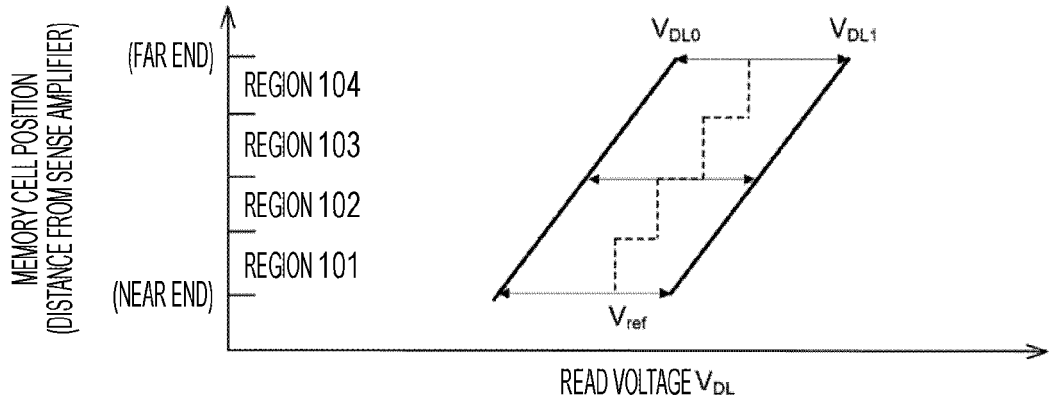
FIG. 15 is a graph illustrating a relationship between a read voltage and a position of a selected memory cell.

FIG. 15 is a graph illustrating the relationship between the read voltage input to the read determination circuit 25 and the position of the selected memory cell MC in the voltage mode, and corresponds to FIG. 7 of the comparative example. In addition, since this corresponds to FIG. 14 illustrating the above-described read current and the read determination circuit 25 reads the voltage value instead of the current value, the voltage value $V_{DL}$ is illustrated on a horizontal axis.

When the selected memory cell MC is included in any region of the regions 101 to 104, the reference voltage $V_{ref}$ is constant in the region. Furthermore, the reference voltage $V_{ref}$ in the same region increases in the order of the first region 101, the second region 102, the third region 103, and the fourth region 104. This is because the resistance value of the variable resistance unit 81 is small when the selected memory cell MC is included in the first region 101, and the resistance value of the variable resistance unit 81 is large when the selected memory cell MC is included in the fourth region 104.

In this manner, the pre-decoded signal output from the AND operator 115 of the row decoder 111 is used for correction of the reference voltage $V_{ref}$ as the selected position information L indicating the region including the selected memory cell MC. The reference voltage $V_{ref}$ obtained in this manner is present between the voltage value $V_{DL1}$ in the high resistance state and the voltage value $V_{DL0}$ in the low resistance state in any of the first region 101 to the fourth region 104. Therefore, the resistance state of the memory cell MC can be determined by comparing the read voltage value $V_{DL}$ with the reference voltage $V_{ref}$.

In the present embodiment, the variable resistance unit 81 corrects the level of the reference signal using a109[0] to [3]a109 which are pre-decoded signals in the row decoder 111. In the first embodiment, the example in which the address signal connected to the address bus on the input side of the row decoder 111 is used for the control of the resistance value of the variable resistance unit 81 has been described, but the present invention is not limited thereto. In the present embodiment, it is also possible to use the decoded signals specifying the word lines (WL0 to WL2047) output from the AND operator 116 illustrated in FIG. 11.

Third Embodiment

In a third embodiment, a case where the memory cell array includes a plurality of sub-arrays will be described. The configuration of the memory cell array by the plurality of sub-arrays may be referred to as a sub-array system.

Figure 16:
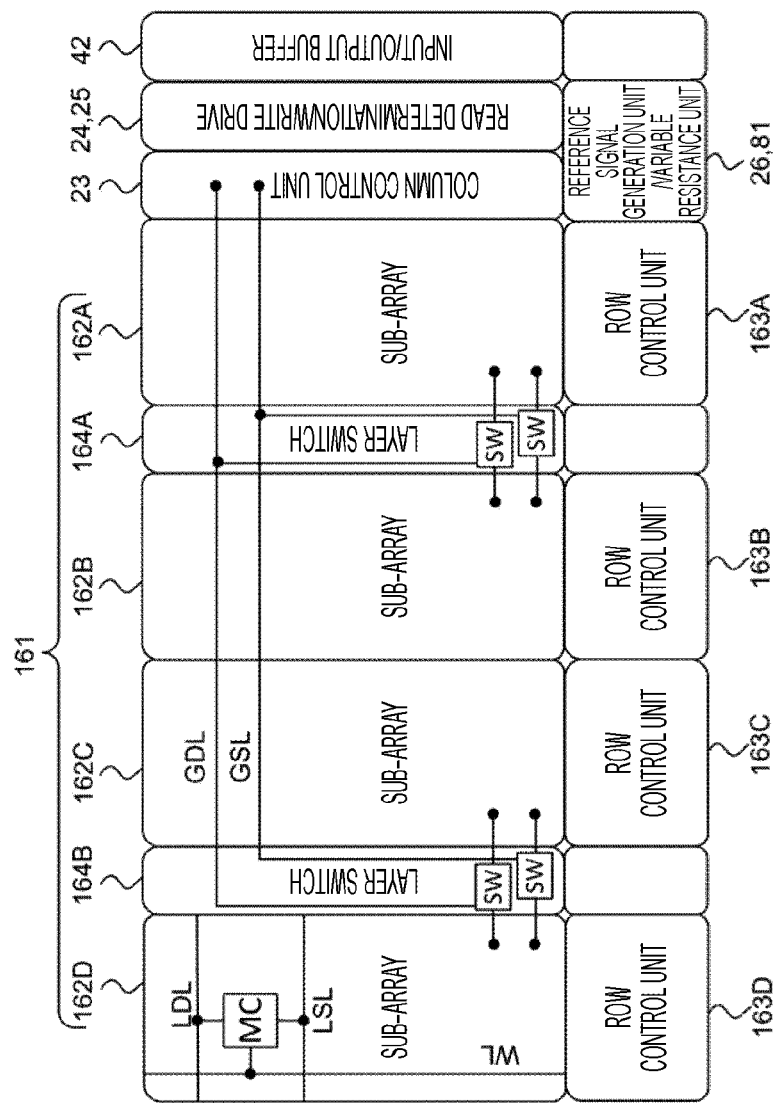
FIG. 16 is an overall configuration diagram of a sub-array-type memory cell array according to a third embodiment.

FIG. 16 is an overall configuration diagram of a memory cell array of a sub-array system according to the third embodiment; Note that, in FIG. 16, the column control unit 23, the write drive 24, the read determination circuit 25, the reference signal generation unit 26, and the input/output buffer 42 on the right side of FIG. 16 are equivalent to the configurations illustrated in FIGS. 2A and 4, and thus, description thereof is omitted. Note that the variable resistance unit 81 is provided together with the reference signal generation unit 26.

The memory cell array 161 includes four sub-arrays 162A to 162D. Each of the sub-arrays 162A to 162D includes a plurality of memory cells MC arranged two-dimensionally. The memory cell MC is connected to the local data line LDL and the local source line LSL in the column direction, and is connected to the word line WL in the row direction. The row control units 163A to 163D are provided in each of the sub-arrays 162A to 162D, and the selection of the word line WL is performed by the row control units 163A to 163D in any of the sub-arrays 162.

In the column direction, the sub-arrays 162A and 162B are arranged in a pair via a layer switch 164A, and the sub-arrays 162C and 162D are arranged in a pair via a layer switch 164B. The column control unit 23 and the layer switches 164A and 164B are connected via a global data line GDL and a global source line GSL.

The layer switch 164A controls connection between the global data line GDL and the local data line LDL of the sub-array 162A or 162B and connection between the global source line GSL and the local source line LSL of the sub-array 162A or 162B. Similarly, the layer switch 164B controls connection between the global data line GDL and the local data line LDL of the sub-array 162C or 162D, and connection between the global source line GSL and the local source line LSL of the sub-array 162C or 162D.

By controlling the layer switches 164A and 164B, the connection between the global data line GDL and the local data line LDL of any one of the sub-arrays 162A to 162D and the connection between the global source line GSL and the local source line LSL of any one of the sub-arrays 162A to 162D are controlled.

As described above, the global data line GDL and the global source line GSL are connected to the local data line LDL of any one of the sub-arrays 162A to 162D and the local source line LSL, so that the sub-array 162 including the selected memory cell MC is selected. Then, the row control unit 163 provided side by side with the sub-array 162 connected by the layer switches 164A and 164B applies a voltage to the predetermined word line WL, whereby the memory cell MC is selected.

The plurality of sub-arrays 162 may be stacked in a height direction to be hierarchically configured. For example, the sub-arrays 162A and 162B and the sub-arrays 162C and 162D may be stacked. By adopting the hierarchical structure, the wiring lengths of the global data line GDL and the global source line GSL can be shortened, and the wiring parasitic resistance can be reduced.

Figure 17:
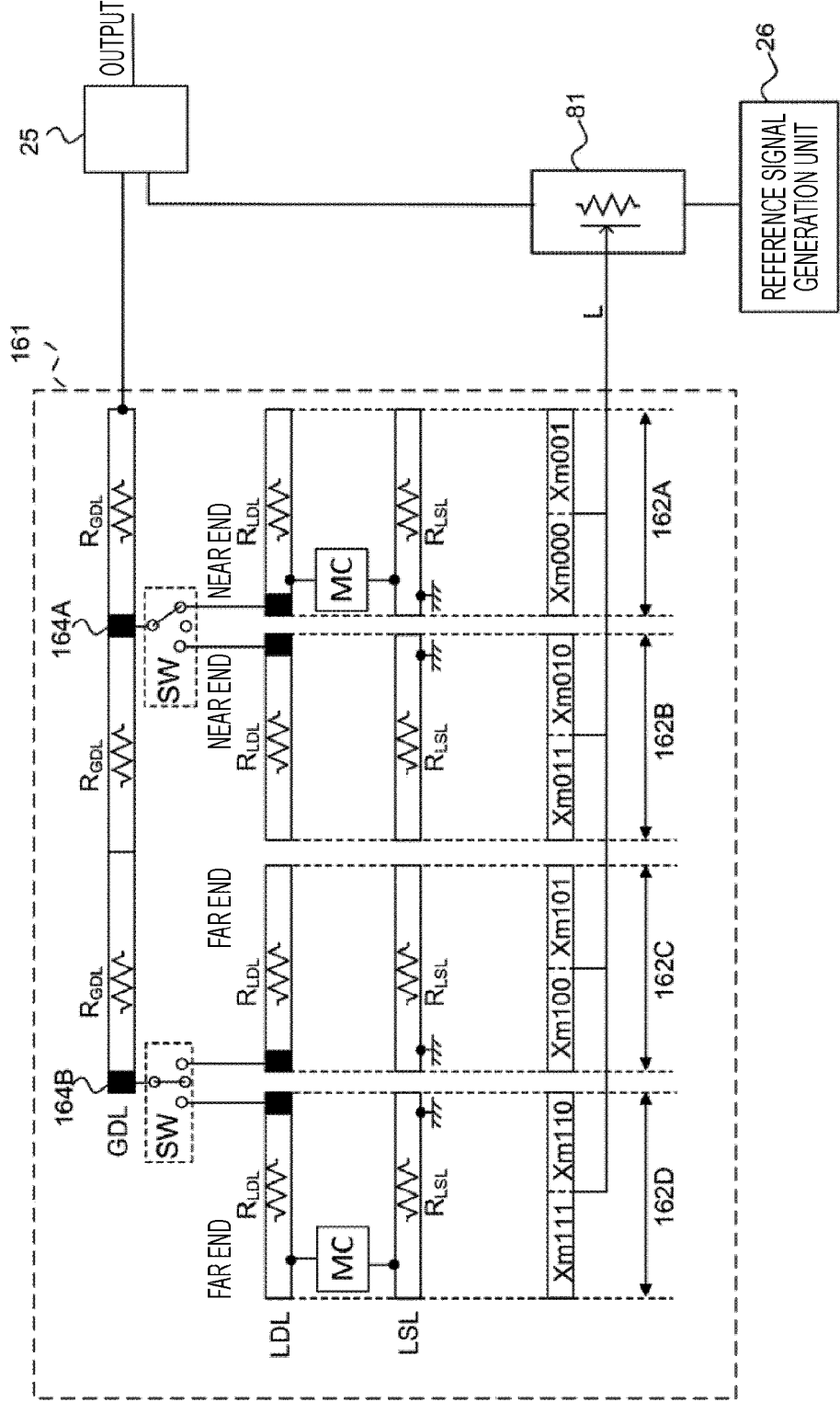
FIG. 17 is a circuit configuration diagram of a memory cell array.

FIG. 17 is a circuit configuration diagram of the memory cell array 161 illustrated in FIG. 16. Here, in the global data line GDL routed in the column direction, the resistance value of the wiring parasitic resistance of the routing portion in the column direction in each of the sub-arrays 162A to 162D is $R_G$DL. It is assumed that resistance values of wiring parasitic resistances of the local data lines LDL and the local source lines LSL provided in the sub-arrays 162A to 162D are $R_{LDL}$ and $R_{LSL}$.

The layer switch 164A is configured to be connectable to a midpoint of the global data line GDL and the end portion (left end of the sub-array 162A in FIG. 17 and right end of the sub-array 162B in FIG. 17) on the side facing the layer switch 164A of the end portions of the local data lines LDL of the sub-arrays 162A and 162B. Note that the midpoint of the global data line GDL connected to the layer switch 164A is located between the sub-arrays 162A and 162B.

Similarly, the layer switch 164B is configured to be connectable to an end portion (left end in FIG. 17) on a side where the read determination circuit 25 of the global data line GDL is not provided and the end portion (left end of the sub-array 162C in FIG. 17 and right end of the sub-array 162D in FIG. 17) on a side facing the layer switch 164B of the end portions of the local data lines LDL of the sub-arrays 162C and 162D.

In FIG. 17, a state in which the memory cells MC in the sub-array 162A are selected is illustrated. Therefore, the layer switch 164A is connected to the sub-array 162A, and the layer switch 164B is not connected to any of the sub-arrays 162C and 162D.

The resistance value of the wiring parasitic resistance of the global data line GDL is determined according to the wiring distance from the read determination circuit 25 to the layer switches 164A and 164B. Therefore, in the global data line GDL, the resistance value of the wiring parasitic resistance between the read determination circuit 25 and the layer switch 164A is $R_{GDL}$, and the resistance value of the wiring parasitic resistance between the layer switches 164A and 164B is $2R_{GDL}$.

In the sub-arrays 162A to 162D, a plurality of memory cells MC are arranged in parallel between the local data line LDL and the local source line LSL. The local source line LSL is grounded on the side where the layer switches 164A and 164B are provided.

Here, in the sub-array 162A, in a region Xm configured by dividing an array length into two, a side connected to the layer switch 164A is referred to as a region Xm000, and the opposite side is referred to as a region Xm001. Similarly, in the sub-array 162B, a side connected to the layer switch 164A is referred to as a region Xm010, and the opposite side is referred to as a region Xm011. In the sub-array 162C, a side connected to the layer switch 164B is referred to as a region Xm100, and the opposite side is referred to as an Xm101. In the sub-array 162D, a side connected to the layer switch 164B is referred to as a region Xm110, and the opposite side is referred to as a region Xm111.

The wiring parasitic resistances according to the selected positions of the memory cells MC of the sub-arrays 162A to 162D are as follows. In a case where the selected memory cell MC is included in the sub-array 162A, the closer the selected position of the memory cell MC is to the connection end (left end) side with the layer switch 164A in the region Xm000, the smaller the wiring parasitic resistance. The closer the selected position is to the end portion (right end) of the region Xm001 on the side not connected to the layer switch 164A, the larger the wiring parasitic resistance.

Similarly, in the sub-array 162B, the closer the selected position of the memory cell MC is to the connection end (right end) of the region Xm010 with the layer switch 164A, the smaller the wiring parasitic resistance. The closer the selected position is to the end portion (left end) of the region Xm011 on the side not connected to the layer switch 164A, the larger the wiring parasitic resistance.

In the sub-array 162C, the wiring parasitic resistance decreases as the selected position of the memory cell MC is closer to the connection end (left end) of the region Xm100 with the layer switch 164B, and the wiring parasitic resistance increases as the selected position is closer to the end portion (right end) of the region Xm101 on the side not connected with the layer switch 164B. In the sub-array 162D, the wiring parasitic resistance decreases as the selected position of the memory cell MC is closer to the connection end (right end) of the region Xm110 with the layer switch 164B, and the wiring parasitic resistance increases as the selected position is closer to the end portion (left end) of the region Xm111 on the side not connected with the layer switch 164B.

That is, the distance of the selected memory cell MC from the read determination circuit 25 based on the wiring parasitic resistance is not a distance based on a physical arrangement position but a distance of a current path to the ground. The far end and the near end are considered as follows. A connection end of the region Xm000 of the sub-array 162A with the layer switch 164A and a connection end of the region Xm010 of the sub-array 162B with the layer switch 164A are near ends. Meanwhile, the end portion of the region Xm101 of the sub-array 162C on the side not connected to the layer switch 164B and the end portion of the region Xm111 of the sub-array 162D on the side not connected to the layer switch 164B are the far ends.

Figure 18:
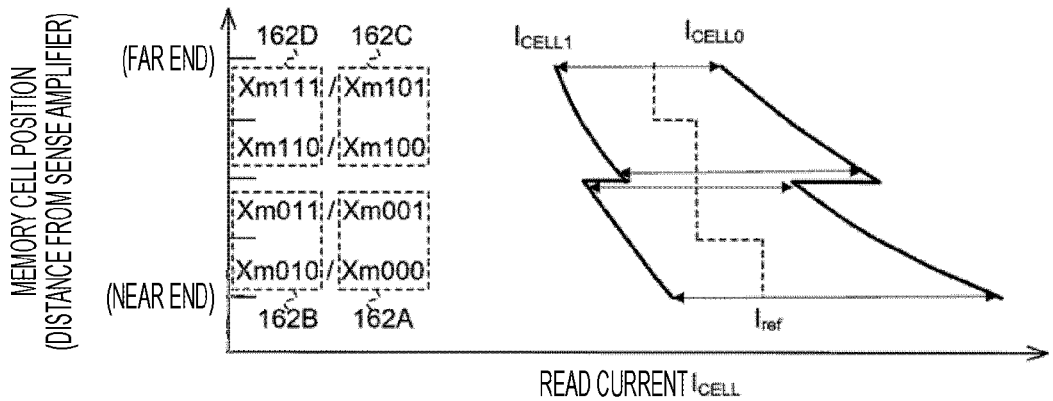
FIG. 18 is a graph illustrating an example of a relationship between a read current and a position of a selected memory cell.

FIG. 18 is a graph illustrating a relationship between the read current input to the read determination circuit 25 and the position of the selected memory cell MC in the current mode, and corresponds to FIG. 6 of the comparative example, FIG. 9 of the first embodiment, and FIG. 14 of the second embodiment.

In FIG. 18, in a vertical axis, as the positions where the memory cells MC are arranged, sub-arrays 162A and 162B relatively close in distance from the read determination circuit 25 are illustrated on the lower side, and sub-arrays 162C and 162D relatively far in distance from the read determination circuit 25 are illustrated on the upper side.

The distance from the read determination circuit 25 increases from the lower side to the upper side in FIG. 18 in the order of the region Xm000 (sub-array 162A) and the region Xm010 (sub-array 162B), the region Xm001 (sub-array 162A) and the region Xm011 (sub-array 162B), the region Xm100 (sub-array 162C) and the region Xm110 (sub-array 162D), the region Xm101 (sub-array 162C), and the region Xm111 (sub-array 162D).

In the following, in order to simplify the description, a configuration will be described using the sub-arrays 162A and 162C. The description of the sub-arrays 162A and 162C can be applied to the sub-arrays 162B and 162D, respectively.

As illustrated in FIG. 18, in each of the sub-arrays 162A (region Xm000, Xm001) and 162C (region Xm100, Xm101), as the distance from the read determination circuit 25 increases (as the sub-arrays are arranged upward in FIG. 18), the wiring parasitic resistance increases, so that the current value $I_{CELL1}$ in the high resistance state and the current value $I_{CELL0}$ in the low resistance state decrease.

As illustrated in the middle part of FIG. 18, the current value $I_{CELL1}$ in the high resistance state and the current value $I_{CELL0}$ in the low resistance state are not continuous between a far end side of the region Xm001 (sub-array 162A) and a near end side of the region Xm100 (sub-array 162C). This is because, as illustrated in FIG. 17, the wiring parasitic resistance in a case where the memory cell MC is selected on the far end side of the region Xm001 (sub-array 162A) is "$R_{GDL}+R_{LDL}+R_{LSL}$", and the wiring parasitic resistance in a case where the memory cell MC is selected on the near end side of the region Xm100 (sub-array 162C) is "$3R_GDL$", and the wiring parasitic resistances of both are not continuous.

In the example of FIG. 18, when "$R_{LDL}+R_{LSL}>2R_{GDL}$" (that is, "$R_{GDL}+R_{LDL}+R_{LSL}>3R_{GDL}$") is satisfied and the memory cell MC is selected on the far end side of Xm001 (sub-array 162A), the wiring parasitic resistance is larger than that in a case where the memory cell MC is selected on the near end side of Xm100 (sub-array 162C). Therefore, in both the current value $I_{CELL1}$ in the high resistance state and the current value $I_{CELL0}$ in the low resistance state, the far end side of Xm001 (sub-array 162A) is smaller than the near end side of Xm100 (sub-array 162C).

Even with such a configuration, the reference current $I_{ref}$ is changed by changing the resistance value of the variable resistance unit 81 according to which of the regions Xm000 to 111 the selected memory cell MC is arranged. By making the reference current $I_{ref}$ exist between the current value $I_{CELL1}$ in the high resistance state and the current value $I_{CELL0}$ in the low resistance state, it is possible to determine the resistance state of the memory cells MC arranged arbitrarily. Note that, in FIG. 18, the reference current $I_{ref}$ changes at 3 levels (Xm000, Xm001 to Xm100, Xm101), and the variable resistance unit 81 may include at least three resistance units.

Figure 19:
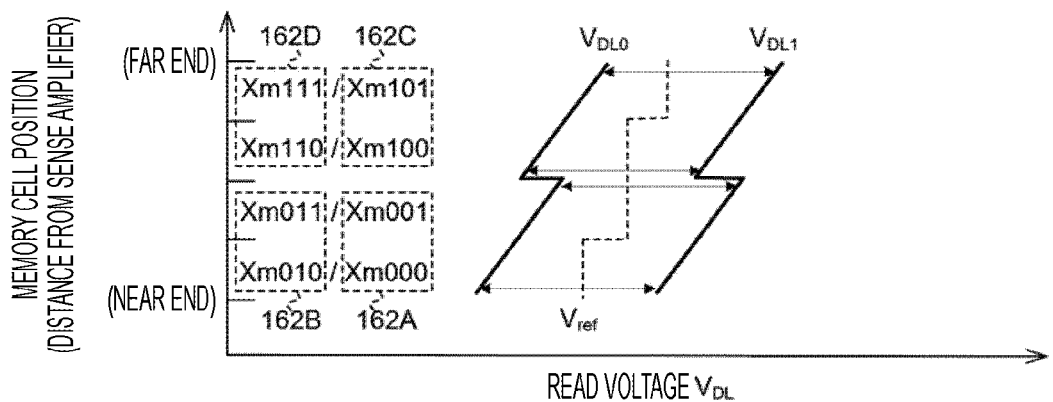
FIG. 19 is a graph illustrating an example of the relationship between the read voltage and the position of the selected memory cell.

FIG. 19 is a diagram illustrating a relationship between the read voltage and the memory cell selected position in the present embodiment in the voltage mode, and corresponds to FIG. 7 of the comparative example and FIG. 15 of the second embodiment. Note that the current value $I_{CELL}$ illustrated in FIG. 18 is inversely proportional to the wiring parasitic resistance, but the voltage value $V_{DL}$ illustrated in FIG. 19 is proportional to the wiring parasitic resistance.

Therefore, in a case where the memory cell MC is selected in the sub-array 162A illustrated in the upper part of FIG. 19 and in a case where the memory cell MC is selected in the sub-array 162C illustrated in the lower part of FIG. 19, the wiring parasitic resistance increases as the distance from the read determination circuit 25 increases (as the sub-array is arranged in the upper part of FIG. 19), so that the read voltage value $V_{DL}$ increases.

In a case where the memory cell MC is selected on the far end side of the region Xm001 (sub-array 162A), the wiring parasitic resistance is larger than that in a case where the memory cell MC is selected on the near end side of the region Xm100 (sub-array 162C), and thus, the voltage value $V_{DL}$ becomes large.

Figure 20:
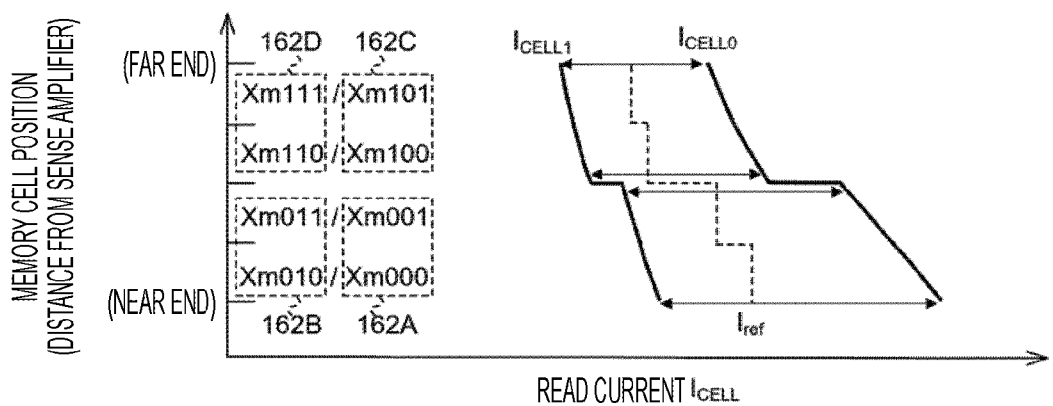
FIG. 20 is a graph illustrating another example of the relationship between the read current and the position of the selected memory cell.
Figure 21:
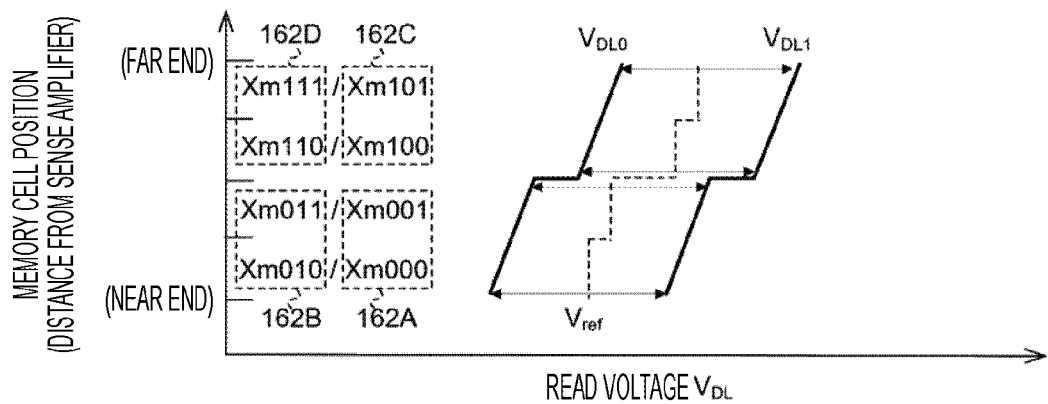
FIG. 21 is a graph illustrating another example of a relationship between a read voltage and the position of the selected memory cell.

FIG. 20 is another diagram illustrating a relationship between the read current and the memory cell selected position in the current mode, and FIG. 21 is another diagram illustrating the relationship between the read voltage and the memory cell selected position in the voltage mode. FIGS. 20 and 21 correspond to FIGS. 18 and 19.

In the examples illustrated in FIGS. 20 and 21, it is assumed that "$R_{LDL}+R_{LSL}<2R_{GDL}$" (that is, "$R_{GDL}+R_{LDL}+R_{LSL}<3R_{GDL}$") is satisfied. Therefore, as illustrated in the middle parts of FIGS. 20 and 21, in a case where the memory cell MC is provided at the far end of the region Xm001 (sub-array 162A), the wiring parasitic resistance is smaller than that in a case where the memory cell MC is provided at the near end of the region Xm100 (sub-array 162C).

As a result, in FIG. 20, in a case where the memory cell MC is selected on the far end side of the region Xm001 (sub-array 162A), the wiring parasitic resistance is smaller than that in a case where the memory cell MC is selected on the near end side of the region Xm100 (sub-array 162C), and thus, the read current value $I_{CELL}$ is large. For the same reason, in FIG. 21, when the memory cell MC is selected at the far end of the region Xm001 (sub-array 162A), the read voltage value $V_{DL}$ is smaller than when the memory cell MC is selected at the near end side of the region Xm100 (sub-array 162C).

As an example other than FIGS. 18 to 21, a case where "$R_{LDL}+R_{LSL}=2R_{GDL}$" (that is, "$R_{GDL}+R_{LDL}+R_{LSL}=3R_{GDL}$") holds will be described as follows. The case where the memory cell MC is selected on the far end side of the region Xm001 (sub-array 162A) and the case where the memory cell MC is selected on the near end side of the region Xm100 (sub-array 162C) have the same wiring parasitic resistance. Therefore, similarly to the examples of FIGS. 14 and 15, the read current value $I_{CELL}$ and the read voltage value $V_{DL}$ are continuous in both.

In this manner, the resistance value of the variable resistance unit 81 is changed in stages according to which of the regions Xm000 to Xm111 the selected memory cell MC is arranged, whereby the reference current $I_{ref}$ and the voltage value $V_{DL1}$ are corrected in stages. Then, when the reference current $I_{ref}$ is present between the current value $I_{CELL1}$ in the high resistance state and the current value $I_{CELL0}$ in the low resistance state, the resistance state of the memory cell MC in any arrangement can be determined. Similarly, when the reference voltage $V_{ref}$ exists between the voltage value $V_{DL1}$ in the high resistance state and the voltage value $V_{DL0}$ in the low resistance state, it is possible to determine the resistance state of the memory cells MC arranged arbitrarily.

Further, continuity between the read current value $I_{CELL}$ and the read voltage value $V_{DL}$ in a case where the selected memory cell MC is included in the sub-array 162A on the near end side and in a case where the selected memory cell MC is included in the sub-array 162C on the far end side can be changed based on a magnitude relationship between "$R_{LDL}+R_{LSL}$" that is a sum of the resistance value $R_{LDL}$ of the local data line LDL and the $R_{LSL}$ of the local source line LSL and "$2R_{GDL}$" that is twice the resistance value of the global data line GDL.

Therefore, when there are limitations on the set values of the reference current $I_{ref}$ and the reference voltage $V_{ref}$, by changing the relationship between "$R_{LDL}+R_{LSL}$" and "$2R_{GDL}$", the resistance state of the memory cell MC can be determined by changing the characteristics of the current value $I_{CELL1}$ in the high resistance state and the current value $I_{CELL0}$ in the low resistance state, and the voltage value $V_{DL1}$ in the high resistance state and the voltage value $V_{DL0}$ in the low resistance state.

Fourth Embodiment

In the first to third embodiments, the reference signal is corrected by changing the resistance value of the variable resistance unit 81 according to the selected position of the selected memory cell MC, but the present invention is not limited thereto. In a fourth embodiment, an example of correcting the reference signal using a dummy cell not including the ferromagnetic element 12 as the variable resistance unit will be described.

Figure 22:
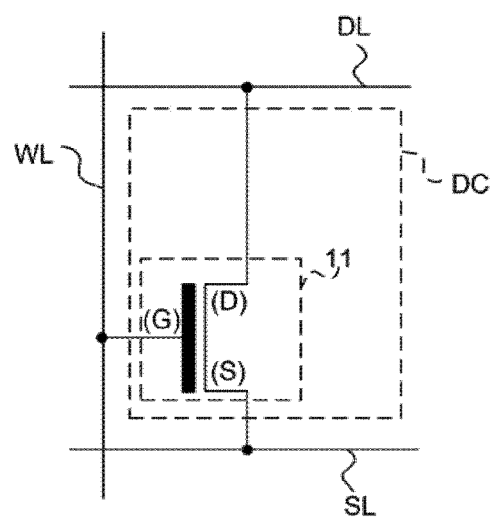
FIG. 22 is a schematic configuration diagram of a dummy cell used in a fourth embodiment.

FIG. 22 is a schematic configuration diagram of a dummy cell used in the fourth embodiment. In a dummy cell DC, as compared with the memory cell MC illustrated in FIG. 1, the ferromagnetic element 12 is not present, and the data line DL and the drain (D) of the transistor 11 are directly connected. Therefore, in a state where the transistor 11 is turned on, the dummy cell DC is in conductive state between the data line DL and the source line SL, and the resistance value becomes 0.

Figure 23:
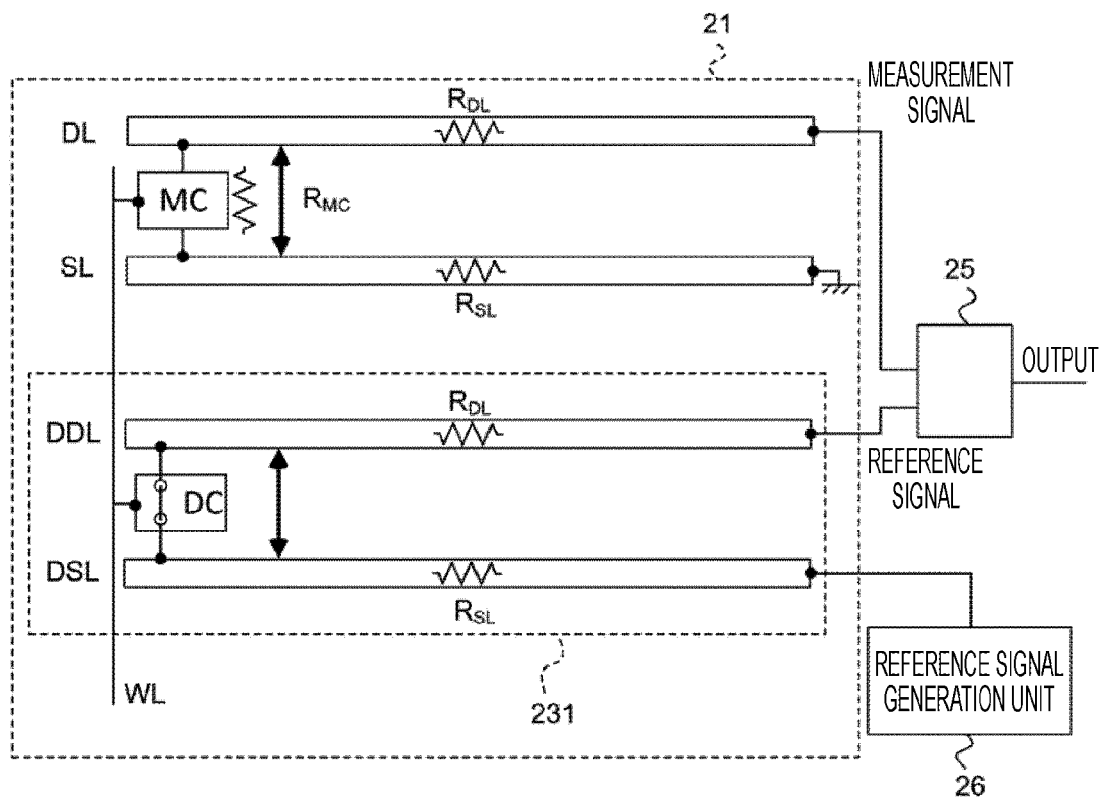
FIG. 23 is an explanatory diagram of a read operation of a memory cell.

FIG. 23 is an explanatory diagram of the read operation of the memory cell MC when the dummy cell DC is used. According to FIG. 23, the dummy cell DC is provided separately from the memory cell MC connected to the data line DL and the source line SL. The dummy cell DC is connected to a dummy data line DDL and a dummy source line DSL. Similarly to the memory cell MC, a plurality of dummy cells DC are arranged in the column direction. The plurality of dummy cells DC operate as the variable resistance unit 231.

In the read determination circuit 25, an input terminal of the measurement signal is connected to the data line DL of the memory cell MC, and an input terminal of the reference signal is connected to the dummy data line DDL of the variable resistance unit 231. An end portion of the variable resistance unit 231 on the read determination circuit 25 side of the dummy source line DSL is connected to the reference signal generation unit 26. Therefore, the reference signal output from the reference signal generation unit 26 is input to the read determination circuit 25 via the variable resistance unit 231 (dummy source line DSL, dummy cell DC, and dummy data line DDL). Note that connection destinations of the dummy source line DSL and the dummy data line DDL may be reversed.

Here, when a voltage is applied to the predetermined word line WL, the transistors 11 of the corresponding memory cell MC and dummy cell DC are turned on. In such a case, the reference signal generated by the reference signal generation unit 26 is input to the other end of the read determination circuit 25 via the dummy cell DC in conductive state.

Since the selected memory cell MC and the dummy cell DC in conductive state are connected to the same word line WL, the wiring parasitic resistances of the data line DL and the source line SL affecting the measurement signal and the wiring parasitic resistances of the dummy data line DDL and the dummy source line DSL affecting the reference signal are both $R_{DL}$ and $R_{SL}$. As described above, the wiring parasitic resistances affecting the measurement signal and the reference signal input to the read determination circuit 25 are substantially the same, and the influence of the wiring parasitic resistance in the comparison between the measurement signal and the reference signal can be suppressed.

Figure 24:
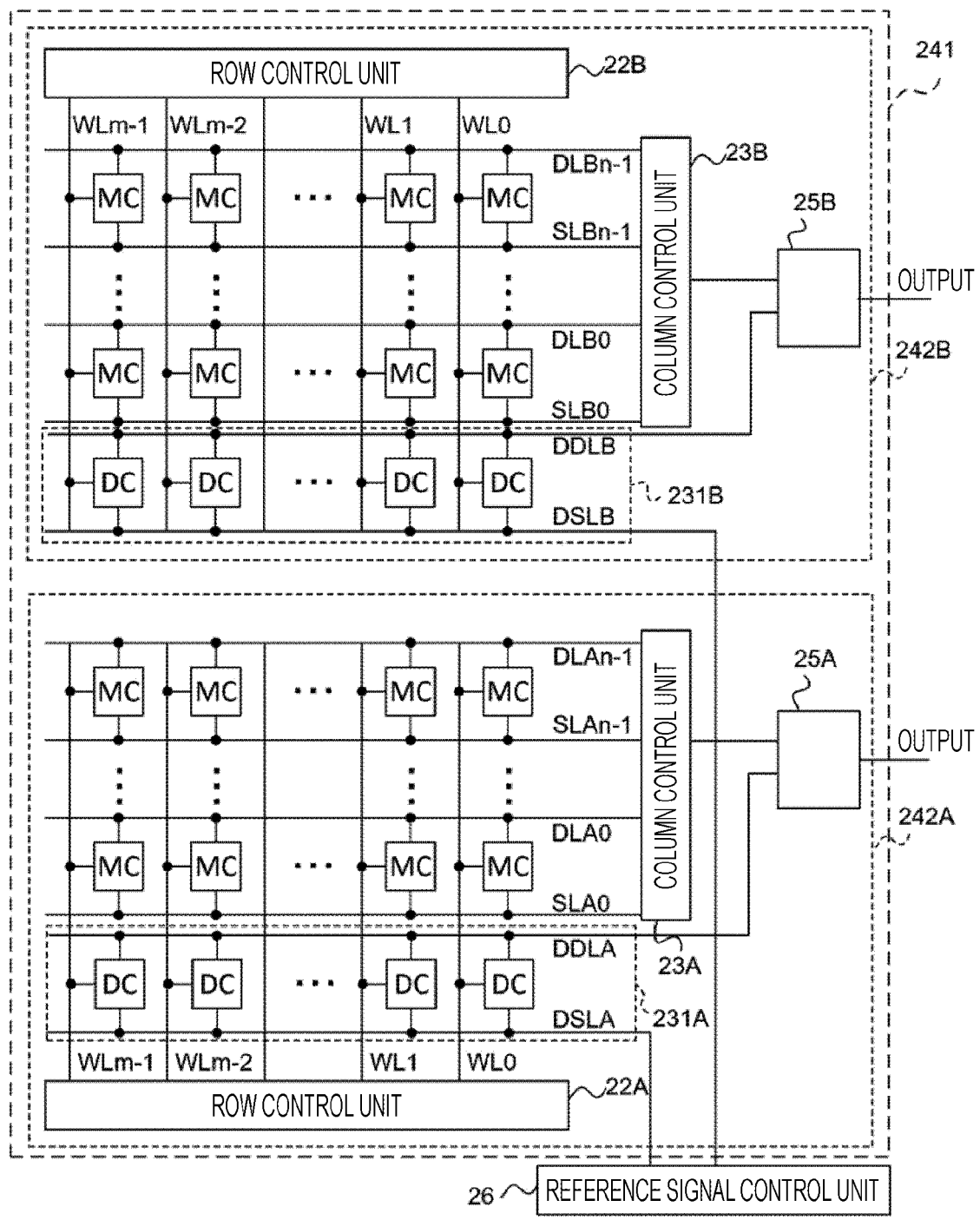
FIG. 24 is an example of a circuit configuration diagram of a configuration of a memory cell array.

FIG. 24 is an example of a circuit configuration diagram of the memory cell array in a case where the dummy cell DC is used. The memory cell array 241 includes sub-arrays 242A and 242B. Each of the sub-arrays 242A and 242B includes memory cells MC, row control units 22A and 22B, column control units 23A and 23B, and read determination circuits 25A and 25B arranged two-dimensionally. In both of the sub-arrays 242A and 242B, variable resistance units 231A and 231B configured by dummy cells DC arranged side by side in the column direction are provided.

The reference signal generation unit 26 is connected to the dummy source lines DSLA and DSLB of the sub-arrays 242A and 242B. The dummy data lines DDLA and DDLB of the sub-arrays 242A and 242B are connected to input terminals of reference signals of the read determination circuits 25A and 25B.

When reading the memory cells MC of the sub-array 242A, the row control unit 22A applies a voltage to a predetermined word line WL. As a result, a predetermined memory cell MC is selected, and a dummy cell DC in the same row as the selected memory cell MC becomes in conductive state. As a result, the wiring parasitic resistance in the measurement signal and the reference signal input to the read determination circuit 25A can be made substantially the same, and the influence of the wiring parasitic resistance in the determination of the resistance state can be suppressed. The same applies to the control in the case of reading the memory cells MC of the sub-array 242B.

Here, as a method of determining the resistance state of the memory cell MC, there are a current detection method in which the current value $I_{CELL}$ is input to the read determination circuit 25 and a voltage detection method in which the voltage value $V_{DL}$ is input. In general, the current value is more likely to be affected by the arrangement of the variable resistance unit 231 than the voltage value. In the example of FIG. 24, the variable resistance units 231A and 231B are provided in the sub-arrays 242A and 242B, and the selected memory cell MC and the dummy cell DC in conductive state are arranged in the same sub-array 242, so that the influence of the wiring parasitic resistance in the determination of the resistance state can be suppressed even in the current detection method. In addition, different word lines can be simultaneously read for each sub-array 242.

Figure 25:
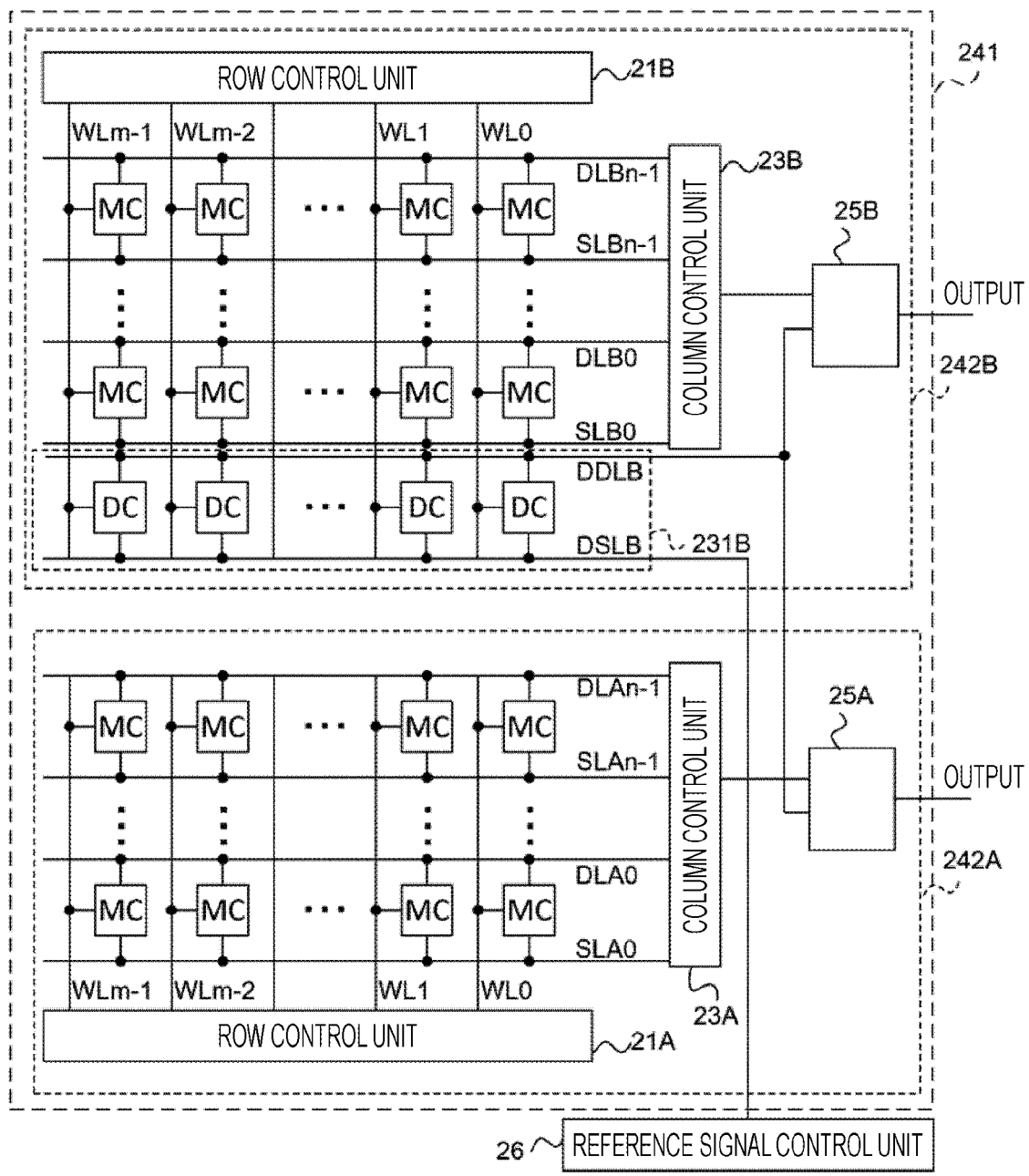
FIG. 25 is another example of a circuit configuration diagram of a configuration of a memory cell array.

FIG. 25 is another example of the circuit configuration diagram of the memory cell array in the case of using the dummy cell DC. Compared with the configuration illustrated in FIG. 24, the variable resistance unit 231A of the sub-array 242A is eliminated. Therefore, the dummy data line DDLB of the variable resistance unit 231B of the sub-array 242B is further connected to the read determination circuit 25A of the sub-array 242A.

The operation in the case of reading the memory cells MC of the sub-array 242B is equivalent to the operation in the example of FIG. 24. Meanwhile, in a case where the memory cells MC of the sub-array 242A are read, the row control unit 21B of the sub-array 242B further applies a voltage to the predetermined word line WL to make the predetermined dummy cells DC of the variable resistance unit 231B conductive. As a result, the wiring parasitic resistances of the memory cell MC selected in the sub-array 242A and the dummy cell DC in conductive state in the sub-array 242B can be made equal. As a result, the wiring parasitic resistances in the measurement signal and the reference signal input to the read determination circuit 25A are substantially the same, and the influence of the wiring parasitic resistance in the determination of the resistance state can be suppressed.

As described above, since the current value is less affected by the arrangement of the variable resistance unit 231 than the voltage value, it is possible to appropriately determine the resistance state of the memory cell MC even with the configuration of FIG. 25 by using the voltage detection method. Furthermore, in the example of FIG. 25, it is not necessary to provide the variable resistance unit 231 for each sub-array 242, and one variable resistance unit 231 may be provided for each memory cell array 241, so that the configuration of the memory cell array 241 can be simplified. However, the sub-array 242 needs to select word lines at the same position.

In the present embodiment, as illustrated in FIG. 22, the dummy cell DC may include another transistor 11 different from the transistor 11 which is a switch element included in the memory cell MC. Such a dummy cell DC does not include the ferromagnetic element 12 when compared in configuration with the memory cell MC. Therefore, as illustrated in FIGS. 24 and 25, by forming a cell in which the ferromagnetic element 12 is not provided in a predetermined column in the memory cell array 241, the dummy cell DC can be configured in the column.

Fifth Embodiment

In the third embodiment, an example in which the reference signal is corrected according to the arrangement of the sub-array in a case where the memory cell array is configured by a plurality of sub-configurations (sub-arrays) has been described, but the present invention is not limited thereto. In a fifth embodiment, an example in which each sub-configuration includes a correction unit that corrects the reference signal according to the arrangement of the sub-configurations will be described.

Figure 26:
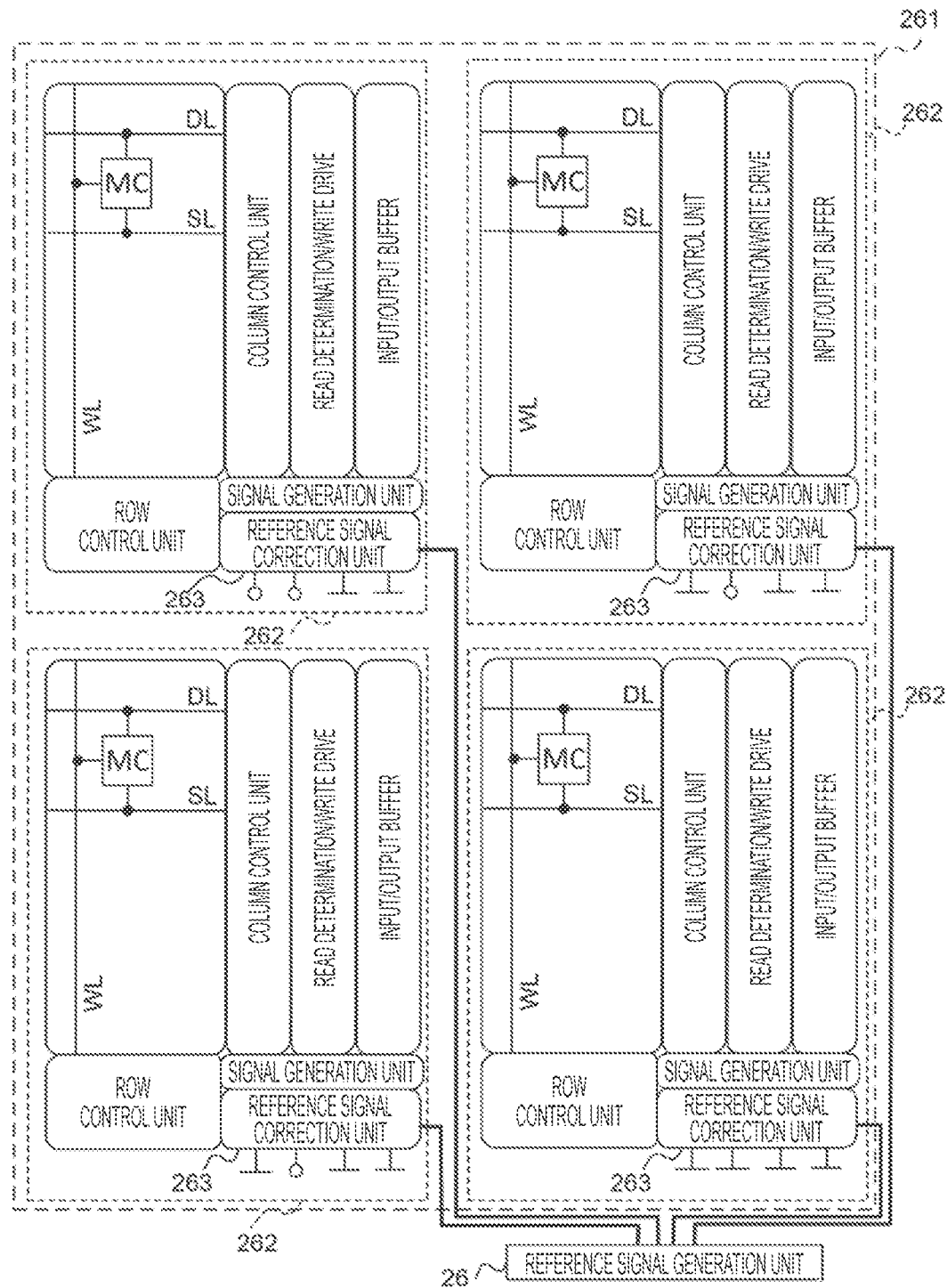
FIG. 26 is a schematic configuration diagram of a semiconductor memory device according to a fifth embodiment.

FIG. 26 is a schematic configuration diagram of a semiconductor memory device according to the fifth embodiment. According to FIG. 26, a semiconductor memory device 261 includes four submodules 262. Note that the submodule 262 has a configuration substantially equivalent to that of the semiconductor memory device 41 illustrated in FIG. 4, and includes a reference signal correction unit 263 having a reference signal correction function according to arrangement instead of the reference signal generation unit 26.

Each of the reference signal correction units 263 is connected to a reference signal generation unit 26 provided outside the submodule 262. The reference signal correction unit 263 corrects the reference signal output from the reference signal generation unit 26 according to the magnitude of the wiring parasitic resistance between the submodule 262 and the reference signal generation unit 26.

With such a configuration, the reference signal generation unit 26 is made common, and the reference signal output from the reference signal generation unit 26 is corrected by the reference signal correction unit 263 in each of the submodules 262. Specifically, the reference signal correction unit 263 corrects the reference signal based on the arrangement position of the submodule 262 in the semiconductor memory device 261 and the wiring parasitic resistance between the submodule 262 and the reference signal generation unit 26.

In this way, by providing the reference signal correction unit 263 for each submodule 262, the reference signal generation unit 26 only needs to transmit the same correction signal regardless of the arrangement position of the submodule 262, so that the entire configuration can be simplified.

In addition, due to encryption of the address signal, scrambling of the physical arrangement, or the like, the logical order of the decoded signal may not match the physical arrangement position of the selected memory. However, the reference signal correction unit 263 is provided for each submodule 262, and the reference signal correction unit 263 includes a decode circuit and a descramble circuit used to decode the encrypted signal, so that the reference signal can be corrected such that the logical order and the physical position arrangement match.

In general, in the semiconductor memory device 261, characteristic dependence (PVT dependence) obtained by optimizing process variation (P), voltage dependence (V), and temperature dependence (T) is different for each submodule 262 and each memory cell MC. The reference signal correction unit 263 provided for each submodule 262 performs correction based on these characteristic dependencies, so that it is possible to reduce number of steps for such as setting due to characteristic dependencies, confirmation of a read operation range at the time of testing correction settings, and confirmation of an operation limit.

The semiconductor memory devices 41 and 261 described above may be mounted on, for example, a semiconductor integrated circuit on which an electronic circuit such as a central processing unit (CPU) or a radio frequency (RF) circuit is mounted. In this case, the semiconductor memory devices 41 and 261 may be integrally integrated and mounted on one semiconductor integrated circuit together with another electronic circuit, or may be mounted later as a separate body on an existing semiconductor integrated circuit provided with another electronic circuit. Similarly, the control device 82 provided in the semiconductor memory device may be mounted later as a separate body on the existing semiconductor integrated circuit provided with the memory cell.

The present invention enables various embodiments and modifications without departing from the broad spirit and scope of the present invention. In addition, the above-described embodiments are for describing the present invention, and do not limit the scope of the present invention. That is, the scope of the present invention is indicated by the claims rather than the embodiments. Various modifications made within the scope of the claims and the meaning of the invention equivalent thereto are regarded as being within the scope of the present invention.

What is claimed is:

1. A semiconductor memory device comprising:
   a memory cell array including a plurality of memory cells each including a resistance change type memory element configured to store a resistance state and a switch;
   a read determination circuit that compares a measurement signal from the memory cell selected in the memory cell array with a reference signal to determine a resistance state so as to read information from the resistance change type memory element; and
   a reference signal correction unit that corrects a level of the reference signal based on a selected position of the memory cell in the memory cell array.

2. The semiconductor memory device according to claim 1, wherein
   the memory cell array includes a plurality of regions, and
   the reference signal correction unit corrects the level of the reference signal according to a position of the region in which the selected memory cell exists.

3. The semiconductor memory device according to claim 1, wherein
   the reference signal correction unit corrects the level of the reference signal so that the level of the reference signal falls between the measurement signal in a case where the resistance change type memory element is in a high resistance state and the measurement signal in a case where the resistance change type memory element is in a low resistance state.

4. The semiconductor memory device according to claim 1, wherein
   the reference signal correction unit
   includes a variable resistance unit, and
   changes a resistance value of the variable resistance unit based on a selected position of the memory cell to correct the level of the reference signal.

5. The semiconductor memory device according to claim 1, wherein
   the reference signal correction unit
   includes a plurality of dummy cells configured to switch a conduction state, and
   selects the dummy cell based on a selected position of the memory cell, and inputs the reference signal to the read determination circuit via the selected dummy cell, thereby corrects the level of the reference signal.

6. The semiconductor memory device according to claim 5, wherein
   the semiconductor memory device includes a word line and a source line, wherein
   the dummy cells are arranged along the word line, and the reference signal correction unit corrects the level of the reference signal by bringing the selected memory cell and the dummy cell connected to the source line into a conductive state, or
   the dummy cells are arranged along the source line, and the reference signal correction unit corrects the level of the reference signal by bringing the selected memory cell and the dummy cell connected to the word line into a conductive state.

7. The semiconductor memory device according to claim 6, wherein
   the dummy cell is another switch different from the switch included in the memory cell.

8. The semiconductor memory device according to claim 1, wherein
   the selected position of the memory cell is a physical arrangement position of the selected memory cell in the memory cell array.

9. The semiconductor memory device according to claim 8, wherein
   the selected position of the memory cell is indicated by at least one of an address signal, a pre-decoded signal, and a decoded signal used to select the memory cell.

10. The semiconductor memory device according to claim 8, wherein
    the physical arrangement position and a logical arrangement position of the memory cells do not match in the memory cell array, and the reference signal correction unit converts the logical arrangement position into the physical arrangement position for the selected position of the memory cell, and corrects the level of the reference signal based on the physical arrangement position obtained by the conversion.

11. The semiconductor memory device according to claim 1, wherein
the reference signal correction unit corrects the reference signal according to an individual difference of the memory cell.

12. The semiconductor memory device according to claim 11, wherein
the individual difference includes a voltage-dependent characteristic or a temperature-dependent characteristic.

13. The semiconductor memory device according to claim 1, wherein
the memory cell array includes a plurality of submodules, and
a plurality of the reference signal correction units are provided corresponding to the submodules, and correct the reference signal based on a selected position of the memory cell in the submodule and a positional relationship between the submodule and a generation device of the reference signal provided outside the submodule.

14. The semiconductor memory device according to claim 1, wherein
the semiconductor memory device is mounted on a semiconductor integrated circuit.

15. A control device for a semiconductor memory device including a memory cell array including a plurality of memory cells each including a resistance change type memory element configured to store a resistance state and a switch, and a read determination circuit that compares a measurement signal from the memory cell selected in the memory cell array with a reference signal, wherein
the control device
corrects a level of the reference signal output from a reference signal generation unit based on a selected position of the memory cell in the memory cell array,
causes the read determination circuit to compare the measurement signal from the memory cell selected in the memory cell array with the reference signal, and
determines a resistance state of the resistance change type memory element based on a comparison result by the read determination circuit.

* * * * *